United States Patent
Lin et al.

(10) Patent No.: US 8,994,185 B2
(45) Date of Patent: Mar. 31, 2015

(54) SEMICONDUCTOR DEVICE AND METHOD OF FORMING VERTICAL INTERCONNECT STRUCTURE WITH CONDUCTIVE MICRO VIA ARRAY FOR 3-D FO-WLCSP

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/043,751

(22) Filed: Oct. 1, 2013

(65) Prior Publication Data

US 2014/0027929 A1 Jan. 30, 2014

Related U.S. Application Data

(63) Continuation of application No. 13/326,128, filed on Dec. 14, 2011, now Pat. No. 8,592,992.

(51) Int. Cl.
*H01L 23/00* (2006.01)
*H01L 23/498* (2006.01)
(Continued)

(52) U.S. Cl.
CPC .......... *H01L 24/06* (2013.01); *H01L 23/49816* (2013.01); *H01L 23/5389* (2013.01); *H01L 21/561* (2013.01); *H05K 1/185* (2013.01); *H01L 24/03* (2013.01); *H01L 24/19* (2013.01); *H01L 24/97* (2013.01); *H01L 24/96* (2013.01); *H01L 21/568* (2013.01); *H01L 23/3128* (2013.01); *H01L 2924/18162* (2013.01); *H01L 2924/13091* (2013.01); *H01L 2224/73267* (2013.01); *H01L 2924/01322* (2013.01); *H01L 2224/131* (2013.01); *H01L 2224/96* (2013.01); *H01L 2224/13111* (2013.01); *H01L 2224/13113* (2013.01); *H01L 2224/13116* (2013.01); (Continued)

(58) Field of Classification Search
USPC ................................. 257/678–733, 787–796, 257/E23.001–E23.194
See application file for complete search history.

(56) References Cited

U.S. PATENT DOCUMENTS 5,250,843 A 10/1993 Eichelberger
5,353,498 A 10/1994 Fillion et al.
(Continued)

FOREIGN PATENT DOCUMENTS

KR 20100009941 1/2010

*Primary Examiner* — Mamadou Diallo
(74) *Attorney, Agent, or Firm* — Robert D. Atkins; Atkins and Associates, P.C.

(57) ABSTRACT

A semiconductor device includes a semiconductor die. An encapsulant is deposited over the semiconductor die. A conductive micro via array is formed outside a footprint of the semiconductor die and over the semiconductor die and encapsulant. A first through-mold-hole (TMH) is formed including a step-through-hole structure through the encapsulant to expose the conductive micro via array. An insulating layer is formed over the semiconductor die and the encapsulant. A micro via array is formed through the insulating layer and outside the footprint of the semiconductor die. A conductive layer is formed over the insulating layer. A conductive ring is formed comprising the conductive micro via array. A second TMH is formed partially through the encapsulant to a recessed surface of the encapsulant. A third TMH is formed through the encapsulant and extending from the recessed surface of the encapsulant to the conductive micro via array.

35 Claims, 20 Drawing Sheets

(51) Int. Cl.
*H01L 23/538* (2006.01)
*H01L 21/56* (2006.01)
*H05K 1/18* (2006.01)
*H01L 23/31* (2006.01)

(52) U.S. Cl.
CPC .............. *H01L2224/13124* (2013.01); *H01L 2224/13139* (2013.01); *H01L 2224/13144* (2013.01); *H01L 2224/13147* (2013.01); *H01L 2224/13155* (2013.01); *H01L 2224/48091* (2013.01); *H01L 2224/73265* (2013.01); *H01L 2224/04105* (2013.01); *H01L 2224/12105* (2013.01)
USPC ........... 257/774; 257/678; 257/733; 257/787; 257/E23.001; 257/E23.194

(56) References Cited

U.S. PATENT DOCUMENTS

| | | |
|---|---|---|
| 5,841,193 A | 11/1998 | Eichelberger |
| 5,987,744 A | 11/1999 | Lan et al. |
| 6,002,169 A | 12/1999 | Chia et al. |
| 6,750,547 B2 | 6/2004 | Jeung et al. |
| 6,753,602 B2 | 6/2004 | Wu |
| 6,998,344 B2 | 2/2006 | Akram et al. |
| 7,545,047 B2 | 6/2009 | Bauer et al. |
| 7,619,901 B2 | 11/2009 | Eichelberger et al. |
| 7,642,128 B1 | 1/2010 | Lin et al. |
| 7,737,565 B2 | 6/2010 | Coffy |
| 7,777,351 B1 | 8/2010 | Berry et al. |
| 7,816,183 B2 | 10/2010 | Kawata |
| 7,834,462 B2 | 11/2010 | Dobritz et al. |
| 7,851,259 B2 | 12/2010 | Kim |
| 8,101,460 B2 | 1/2012 | Pagaila et al. |
| 2004/0145044 A1 | 7/2004 | Sugaya et al. |
| 2005/0236709 A1 | 10/2005 | Eng et al. |
| 2008/0111233 A1 | 5/2008 | Pendse |
| 2008/0169546 A1 | 7/2008 | Kwon et al. |
| 2008/0258289 A1 | 10/2008 | Pendse et al. |
| 2008/0284045 A1 | 11/2008 | Gerber et al. |
| 2008/0308928 A1 | 12/2008 | Chang et al. |
| 2008/0315385 A1 | 12/2008 | Gerber et al. |
| 2009/0075428 A1* | 3/2009 | Tang et al. .................. 438/114 |
| 2009/0212420 A1* | 8/2009 | Hedler et al. ................ 257/737 |
| 2009/0236686 A1 | 9/2009 | Shim et al. |
| 2010/0117218 A1 | 5/2010 | Park et al. |
| 2010/0140813 A1 | 6/2010 | Pagaila et al. |
| 2010/0171205 A1 | 7/2010 | Chen et al. |
| 2010/0171207 A1 | 7/2010 | Shen et al. |
| 2010/0224974 A1 | 9/2010 | Shim et al. |
| 2010/0317153 A1 | 12/2010 | Do et al. |
| 2011/0278736 A1 | 11/2011 | Lin et al. |
| 2012/0306104 A1 | 12/2012 | Choi et al. |

* cited by examiner

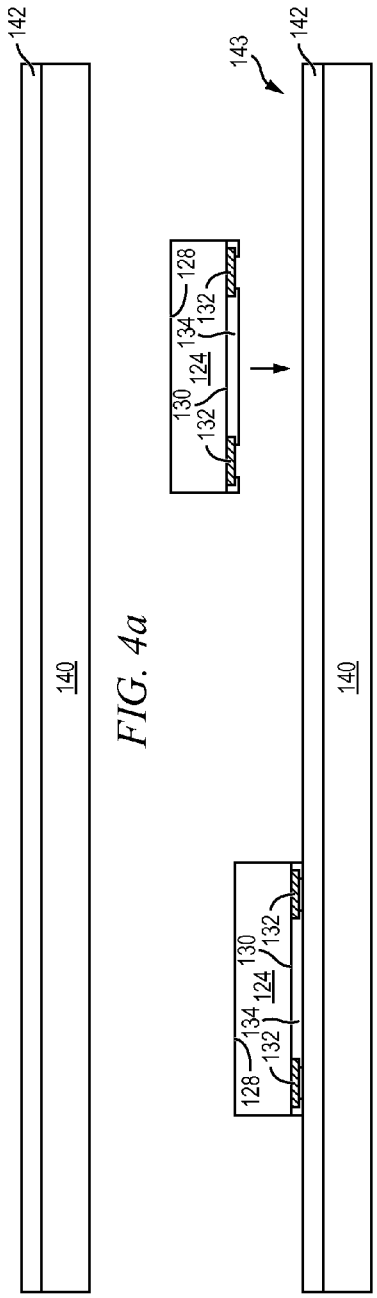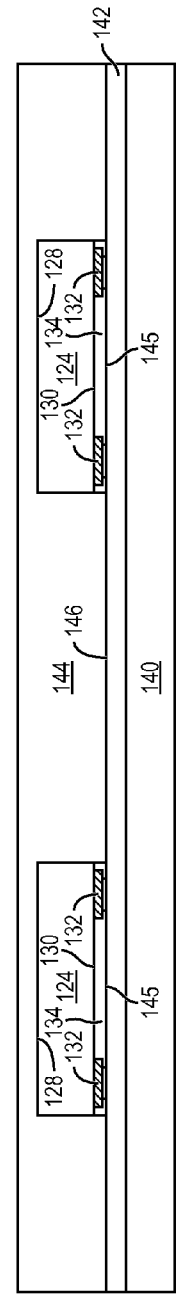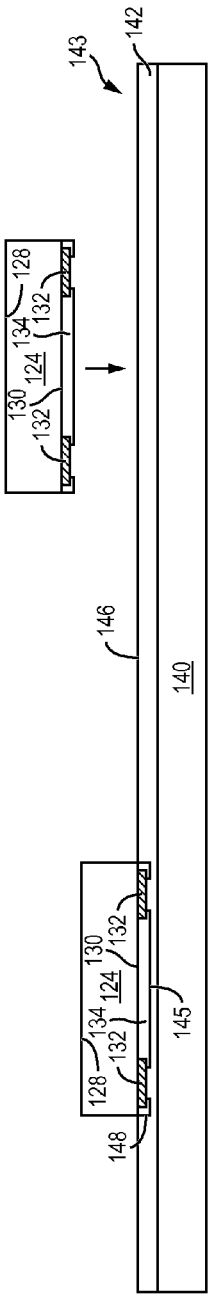

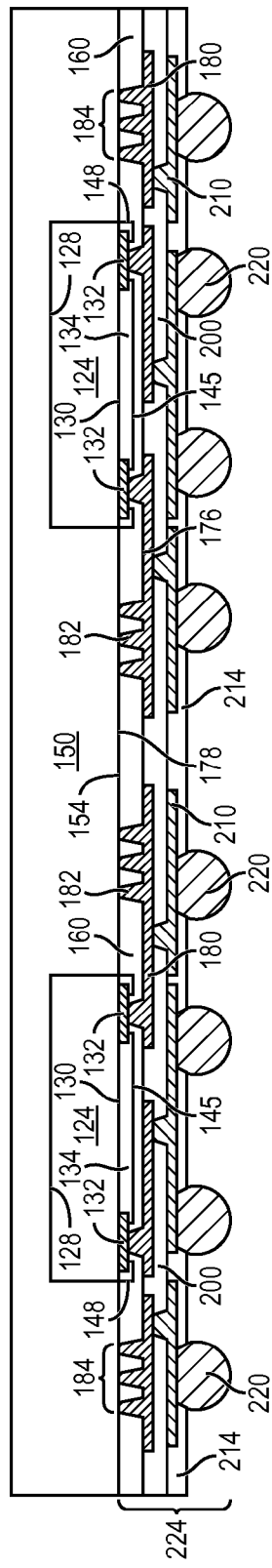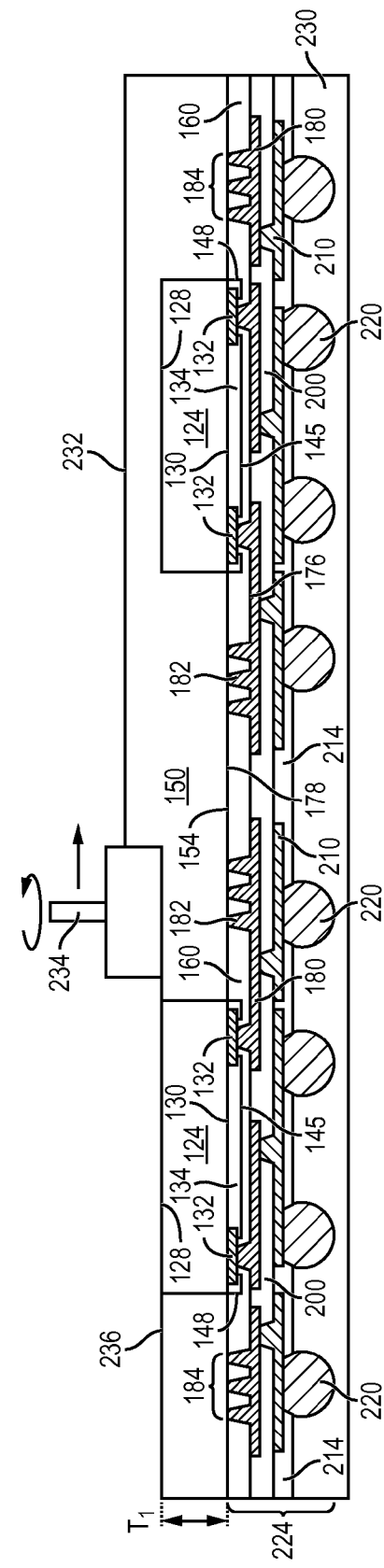

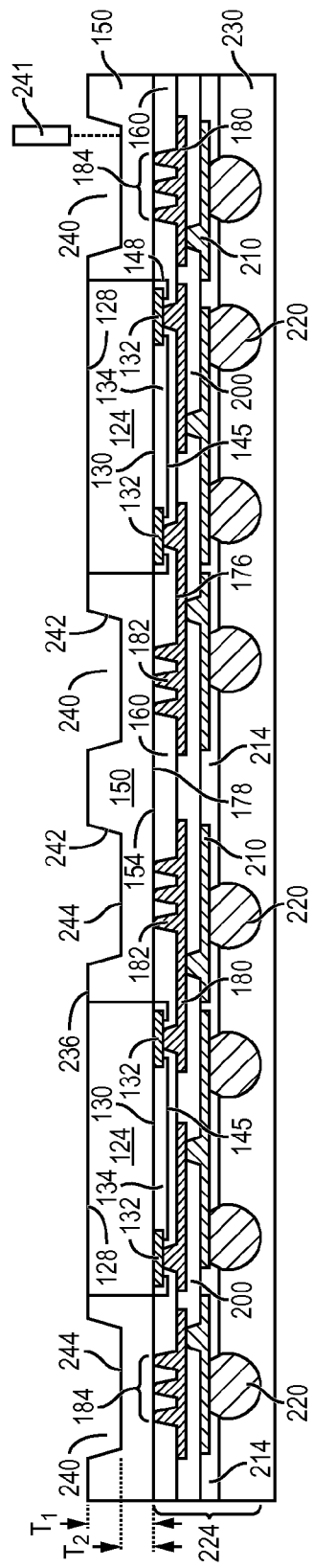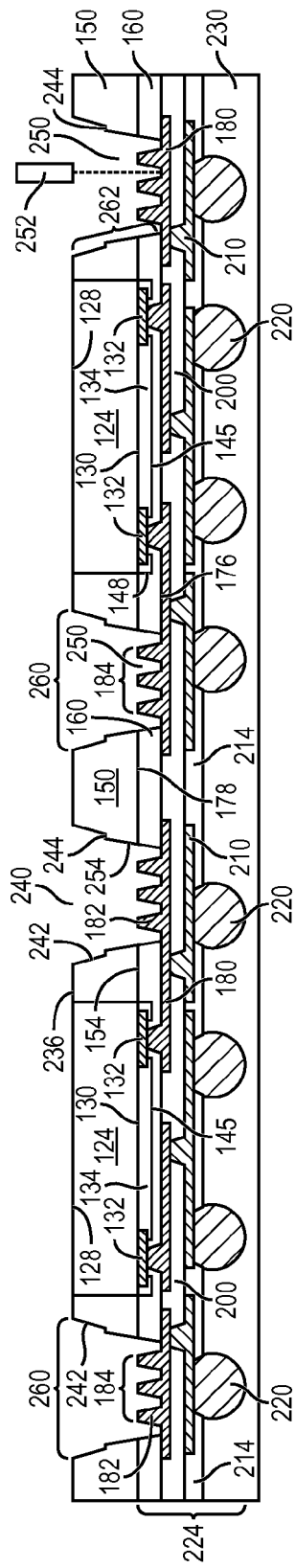

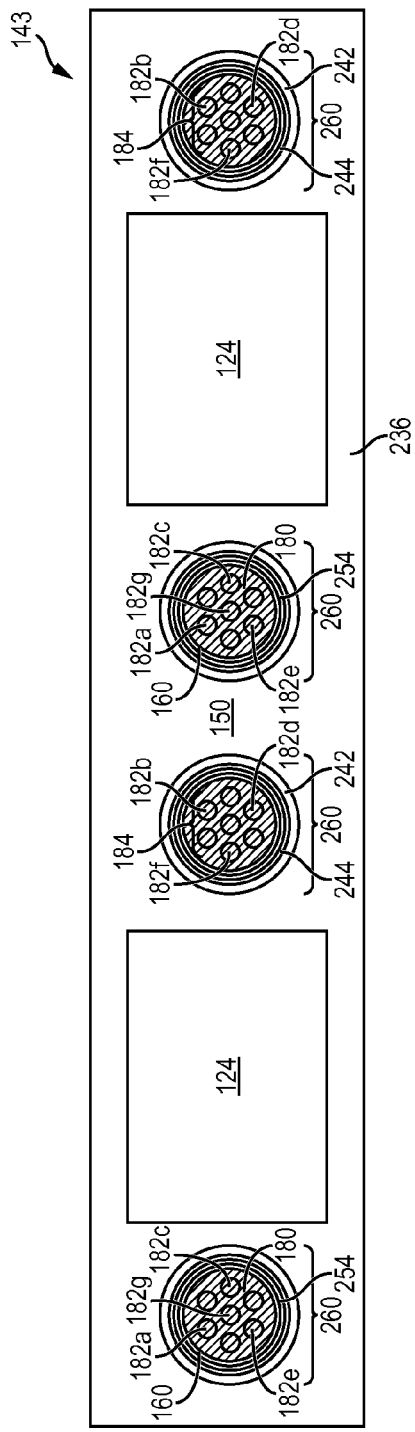
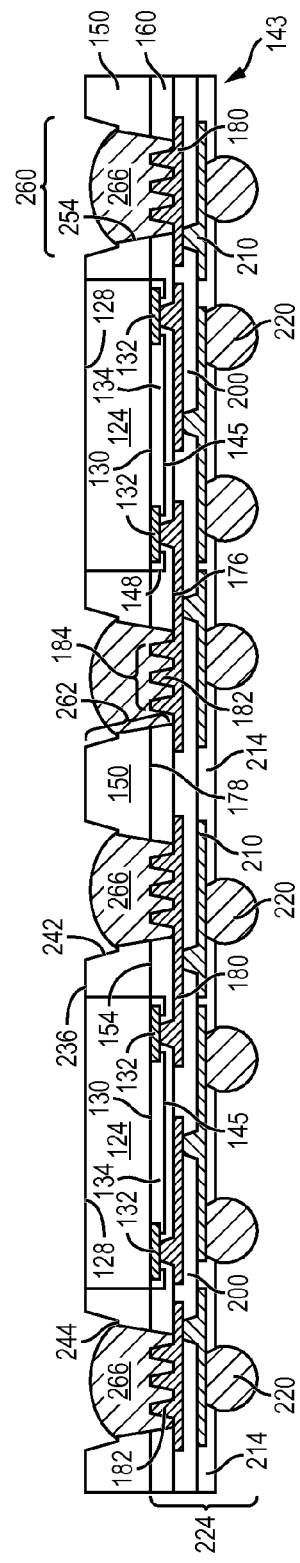
FIG. 4u
FIG. 4v

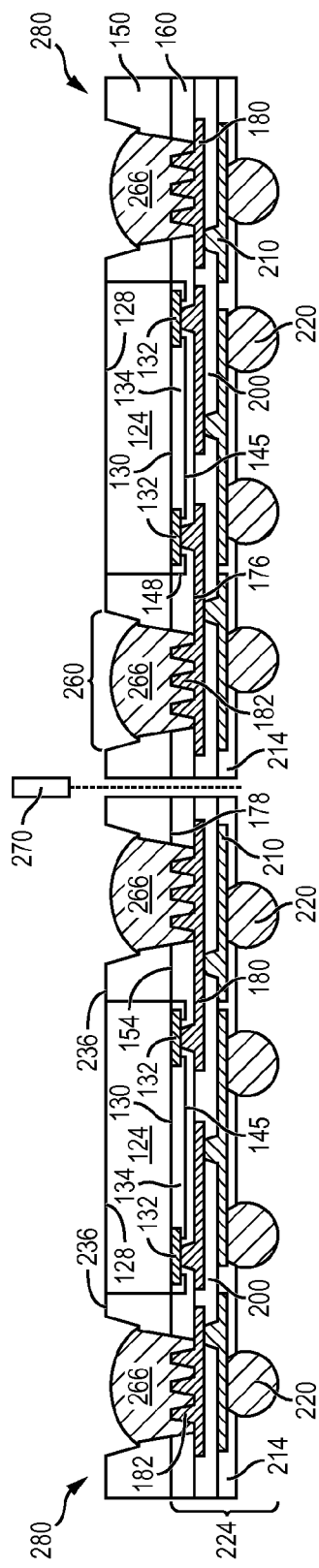
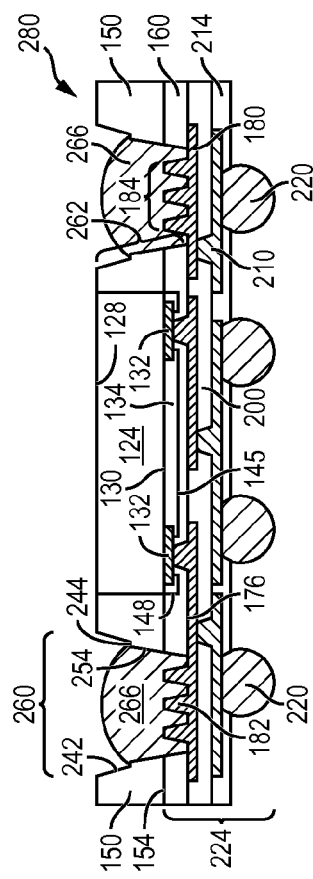
FIG. 4w
FIG. 5

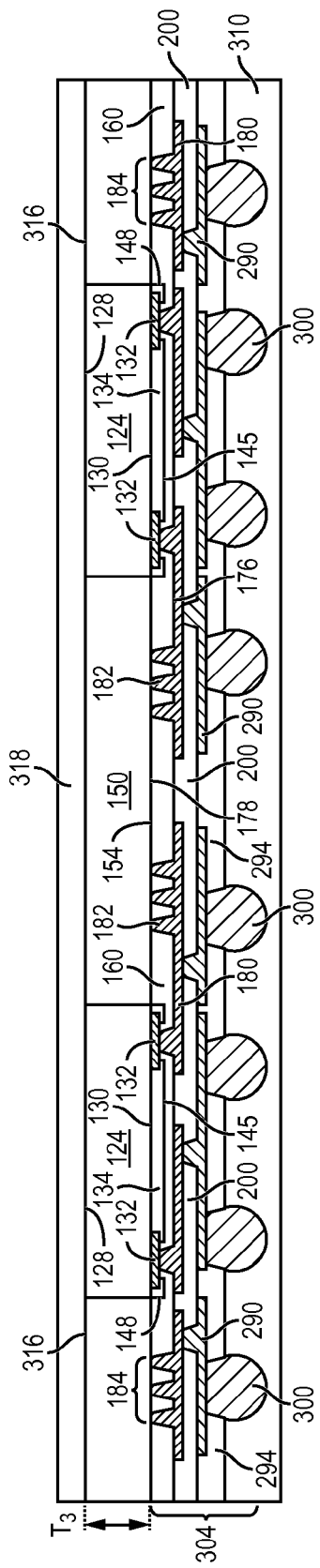
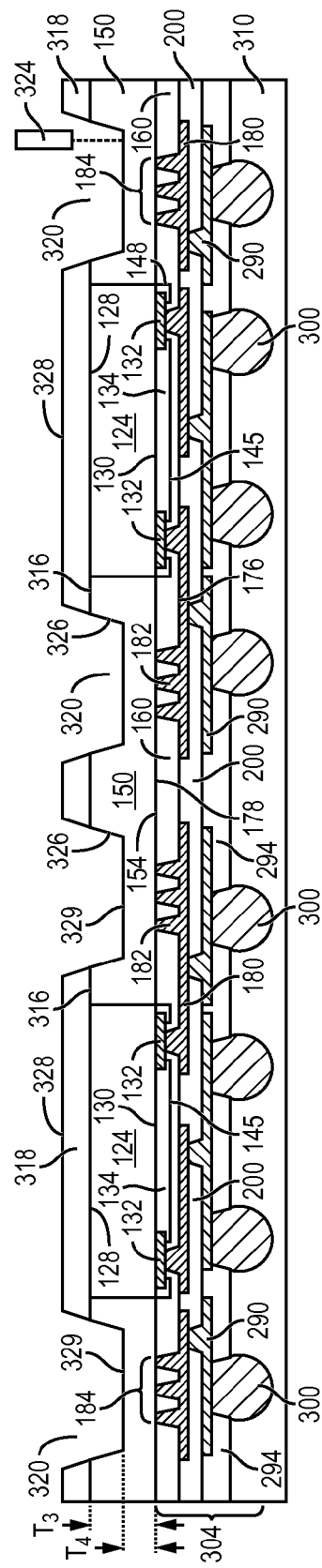
FIG. 6d
FIG. 6e

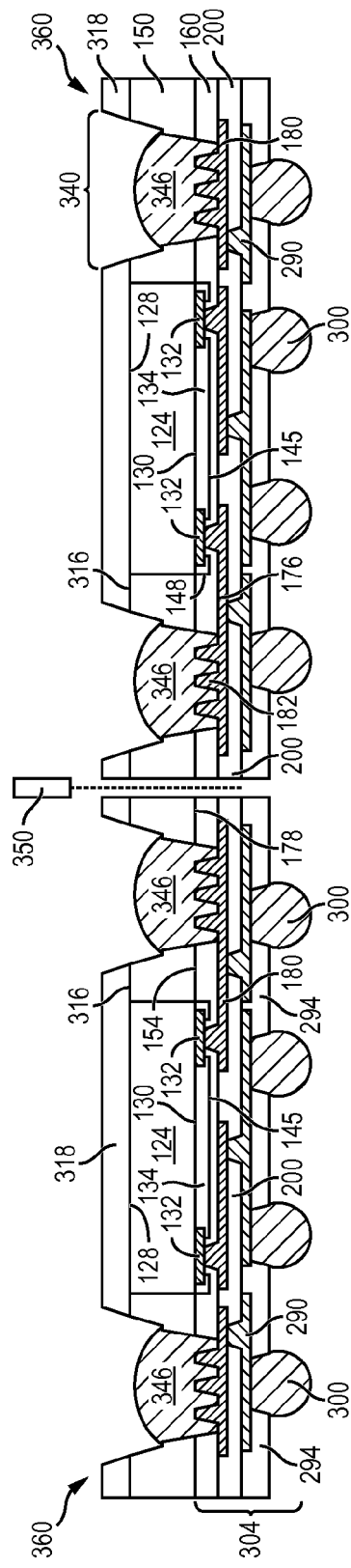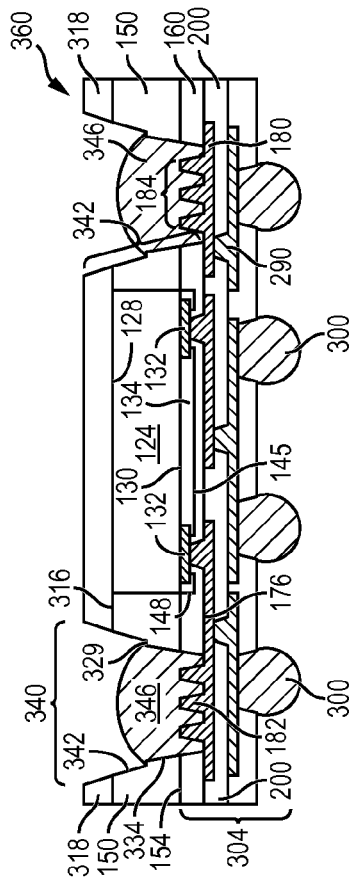

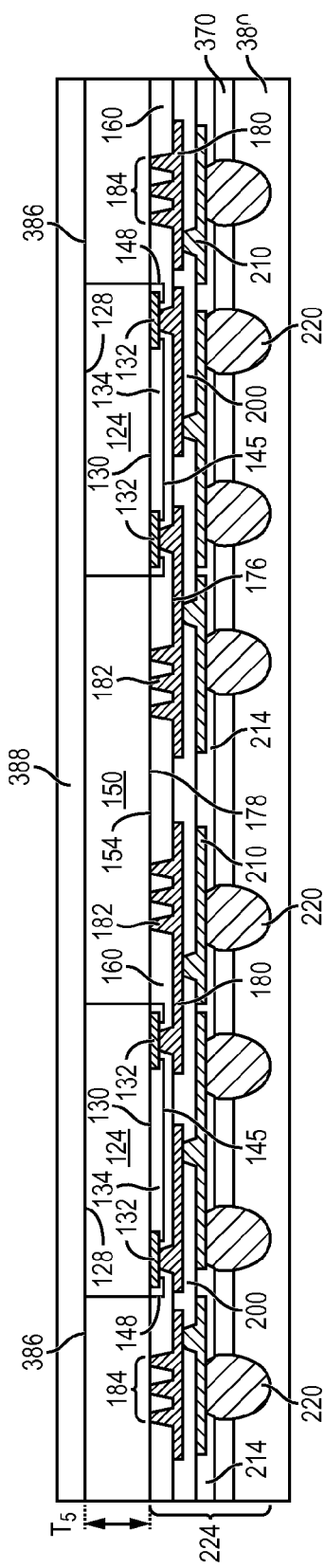

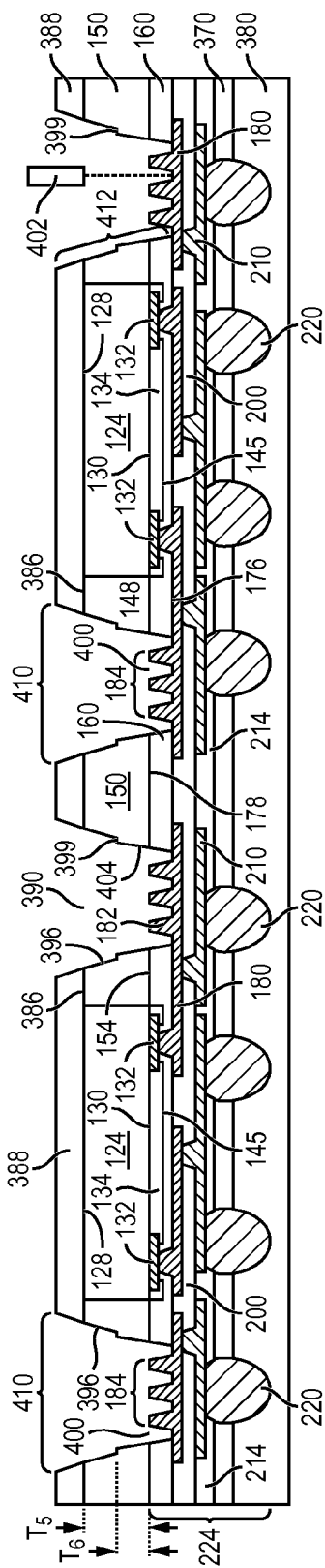
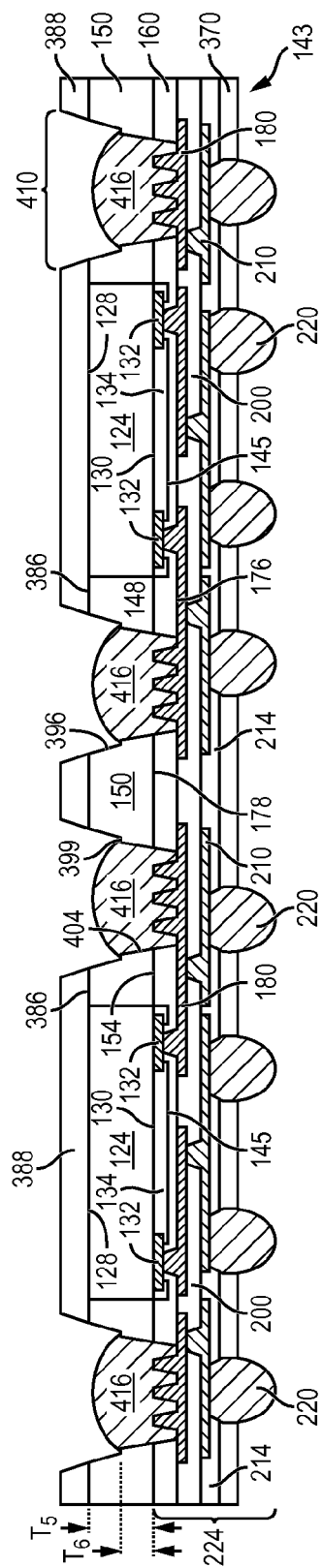
FIG. 8e
FIG. 8f

SEMICONDUCTOR DEVICE AND METHOD OF FORMING VERTICAL INTERCONNECT STRUCTURE WITH CONDUCTIVE MICRO VIA ARRAY FOR 3-D FO-WLCSP

CLAIM OF DOMESTIC PRIORITY

The present application is a continuation of U.S. patent application Ser. No. 13/326,128, now U.S. Pat. No 8,592,992, filed Dec. 14, 2011, which application is incorporated herein by reference.

FIELD OF THE INVENTION

The present invention relates in general to semiconductor devices and, more particularly, to a semiconductor device and method of forming a vertical interconnect structure with a conductive micro via array for three-dimensional (3-D) fan-out wafer level chip scale packages (Fo-WLCSPs).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a conventional Fo-WLCSP, a semiconductor die with contact pads is mounted to a carrier. An encapsulant is deposited over the semiconductor die and the carrier. The carrier is removed and a build-up interconnect structure is formed over the encapsulant and semiconductor die. The electrical interconnection between a Fo-WLCSP containing semiconductor devices on multiple levels (3-D device integration) and external devices can be accomplished by forming redistribution layers (RDLs) within a build-up interconnect structure over both a front side and a backside of a semiconductor die within a Fo-WLCSP. The formation of multiple RDLs including over a front side and backside of a semiconductor die can be a slow and costly approach for making electrical interconnection for 3-D Fo-WLCSPs and can result in higher fabrication costs. Furthermore, the RDLs of build-up interconnect structures are prone to cracking and warping under stress, which can propagate through the RDLs to the semiconductor die and contact pads causing defects in the electrical interconnection. Conductive interconnect structures can be formed within the Fo-WLCSPs and electrically connected to the RDLs to provide vertical electrical interconnection for 3-D device integration. Conductive interconnect structures formed within Fo-WLCSPs can have poor electrical and mechanical connectivity with the RDLs. Additionally, the process of forming conductive interconnect structures can reduce structural support for the RDLs, particularly when openings are formed in the package over the RDLs. Forming build-up interconnect structures and conductive interconnect structures within Fo-WLCSPs can also lead to warpage before and after removal of the carrier.

SUMMARY OF THE INVENTION

A need exists for a simple, cost effective, and reliable vertical electrical interconnect structure for semiconductor die. Accordingly, in one embodiment, the present invention is a method of making a semiconductor device comprising the steps of providing a semiconductor die, depositing an encapsulant over the semiconductor die, forming a conductive micro via array outside a footprint of the semiconductor die and over the semiconductor die and encapsulant, and forming a first through-mold-hole (TMH) through the encapsulant to expose the conductive micro via array.

In another embodiment, the present invention is a method of making a semiconductor device comprising the steps of providing a semiconductor die, depositing an encapsulant over the semiconductor die, and forming a conductive micro via array including a plurality of conductive vias over the encapsulant and outside a footprint of the semiconductor die.

In another embodiment, the present invention is a method of making a semiconductor device comprising the steps of providing a semiconductor die, forming an encapsulant over the semiconductor die, forming an insulating layer over the encapsulant, and forming a conductive micro via array through the insulating layer.

In another embodiment, the present invention is a semiconductor device comprising a semiconductor die. An insulating layer is formed over the semiconductor die. A conductive micro via array is formed through the insulating layer.

BRIEF DESCRIPTION OF THE DRAWINGS

FIG. 5 illustrates a 3-D Fo-WLCSP having a vertical interconnect structure;

FIGS. 6a-6h illustrate a process of forming a vertical interconnect structure for a 3-D Fo-WLCSP with a backside protection and balance layer;

FIG. 7 illustrates a 3-D Fo-WLCSP having a vertical interconnect structure with a backside protection and balance layer;

FIGS. 8a-8g illustrate a process of forming a vertical interconnect structure for a 3-D Fo-WLCSP with front-side and backside protection and balance layers.

DETAILED DESCRIPTION OF THE DRAWINGS

Figure 1:
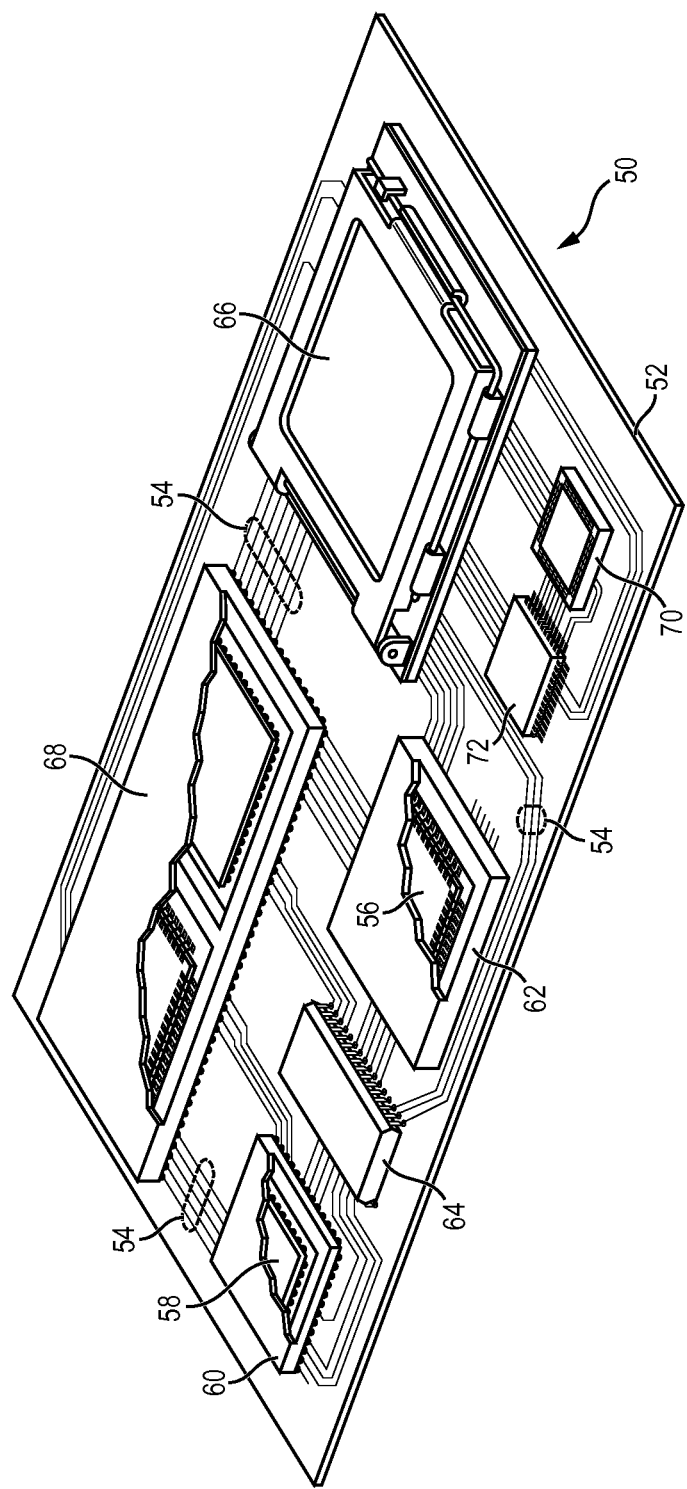
FIG. 1 illustrates a printed circuit board with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
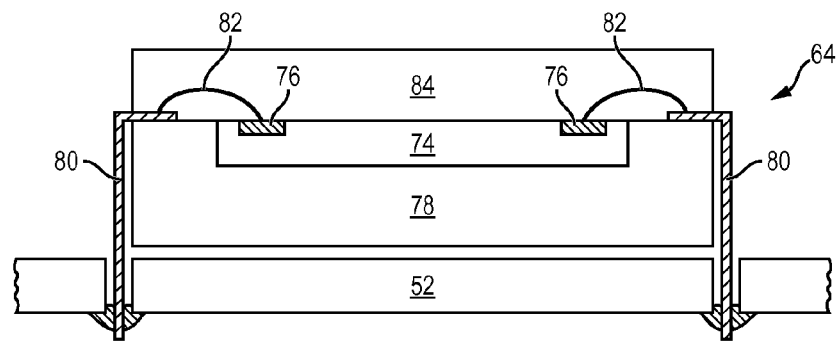
FIGS. 2a-2c illustrate further detail of the representative semiconductor packages mounted to the printed circuit board.
Figure 2B:
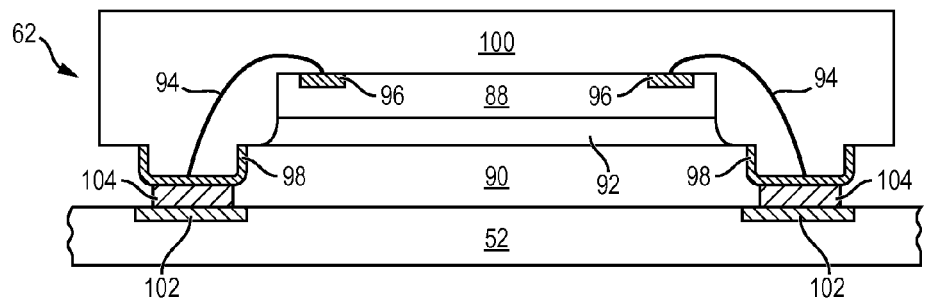
Figure 2C:
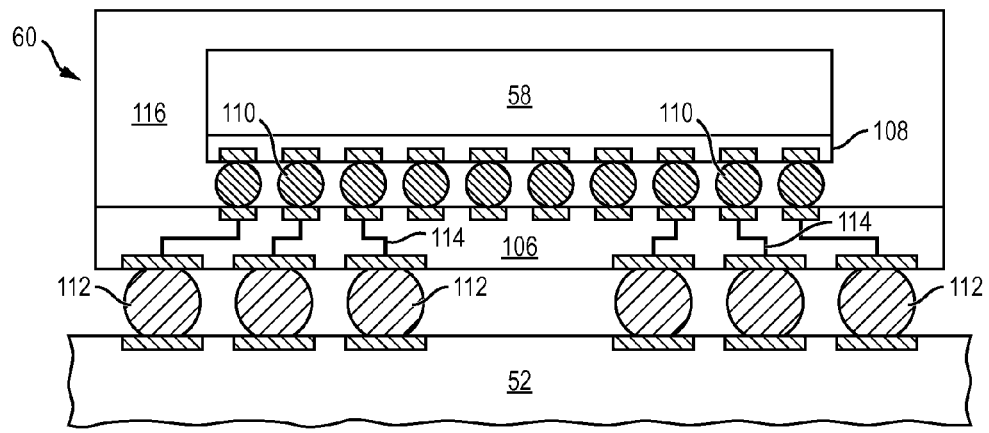

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
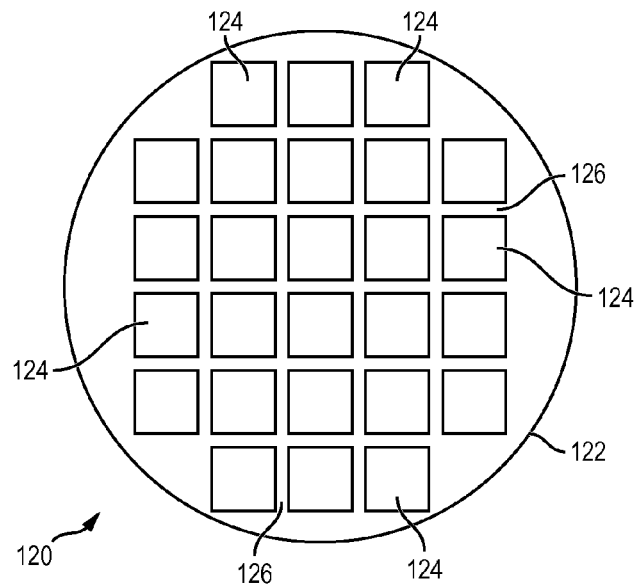
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
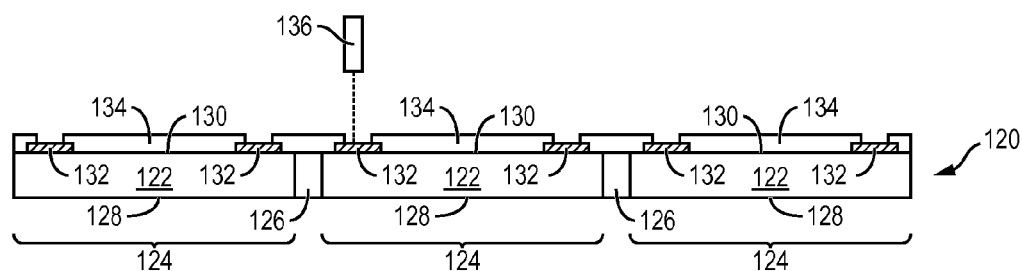

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 3b. Alternatively, conductive layer 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, screen printing or lamination. Insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 is removed by an etching process with a patterned photoresist layer, to expose conductive layer 132. Alternatively, a portion of insulating layer 134 is removed by laser direct ablation (LDA) using laser 136 to expose conductive layer 132.

Figure 3C:
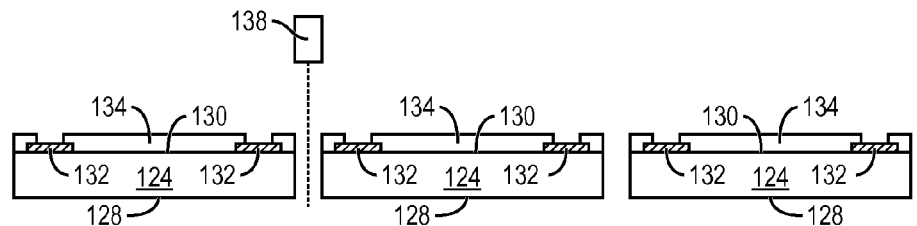

In FIG. 3c, semiconductor wafer 120 is singulated through saw street 126 using a saw blade or laser cutting tool 138 into individual semiconductor die 124.

FIGS. 4a-4w illustrate, in relation to FIGS. 1 and 2a-2c, a process of forming a vertical interconnect structure for a 3-D Fo-WLCSP. In FIG. 4a, a substrate or carrier 140 contains sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. Carrier 140 can be circular or rectangular according to the design or function of the semiconductor package.

In FIG. 4b, leading with insulating layer 134, semiconductor die 124 from FIG. 3c are positioned over and mounted to interface layer 142 and carrier 140 using a pick and place operation with active surface 130 oriented toward the carrier. Semiconductor die 124 are mounted to carrier 140 as part of reconstituted or reconfigured wafer 143.

In FIG. 4c, an encapsulant or molding compound 144 is deposited over semiconductor die 124 and carrier 140 using a paste printing, compressive molding, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants. A surface 145 of insulating layer 134 is coplanar with an exposed surface 146 of interface layer 142.

FIGS. 4d-4w illustrate another embodiment, in which surface 145 of insulating layer 134 is embedded within interface layer 142 after mounting semiconductor die 124 to carrier 140. Continuing from FIG. 4a, leading with insulating layer 134, semiconductor die 124 from FIG. 3c are positioned over and mounted to interface layer 142. Surface 145 of insulating layer 134 is embedded within interface layer 142 and surface 145 is vertically offset from surface 146 of interface layer 142 opposite carrier 140. A portion of interface layer 142 covers a sidewall 148 of insulating layer 134. In one embodiment, active surface 130 of semiconductor die 124 is coplanar with surface 146 of interface layer 142. Semiconductor die 124 are mounted to carrier 140 as part of reconfigured wafer 143.

Figure 4E:
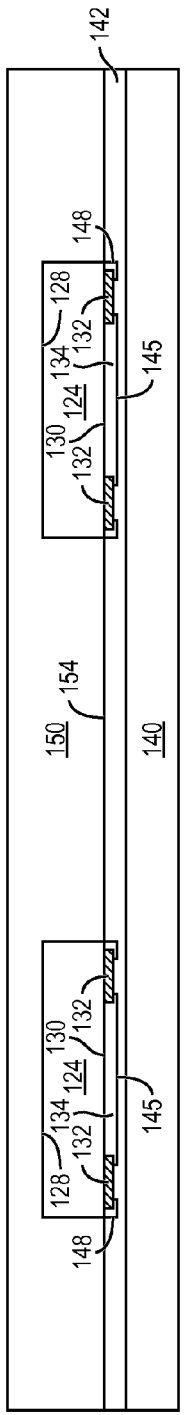
FIGS. 4a-4w illustrate a process of forming a vertical interconnect structure for a 3-D Fo-WLCSP.

In FIG. 4e, an encapsulant or molding compound 150 is deposited over semiconductor die 124, and carrier 140 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive and environmentally protects the semiconductor device from external elements and contaminants. Surface 145 of insulating layer 134 is vertically offset from a surface 154 of encapsulant 150 contacting interface layer 142. Thus, surface 154 of encapsulant 150 and surface 145 of insulating layer 134 are non-planar.

Figure 4F:
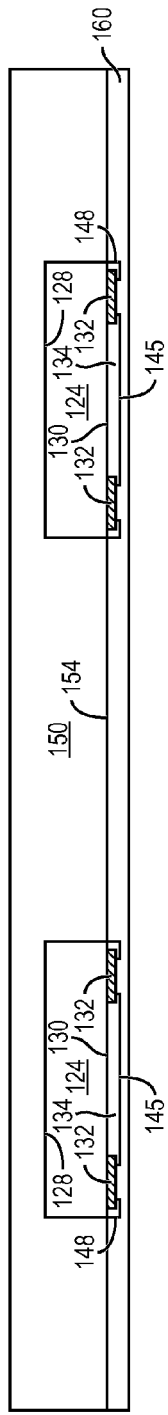

In FIG. 4f, carrier 140 and interface layer 142 are removed by chemical etching, mechanical peeling, chemical mechanical planarization (CMP), mechanical grinding, thermal bake, UV light, laser scanning, or wet stripping to expose conductive layer 132, insulating layer 134, and encapsulant 150. Encapsulant 150 provides structural support for semiconductor die 124 after removal of carrier 140.

An insulating or passivation layer 160 is formed over encapsulant 150 and insulating layer 134 using PVD, CVD, printing, spin coating, spray coating, screen printing or lamination. Insulating layer 160 contains one or more layers of photosensitive polymer dielectric film with or without fillers, non-photosensitive polymer dielectric film, SiO 2, Si3N4, SiON, Ta2O5, Al2O3, or other material having similar insulating and structural properties.

Figure 4G:
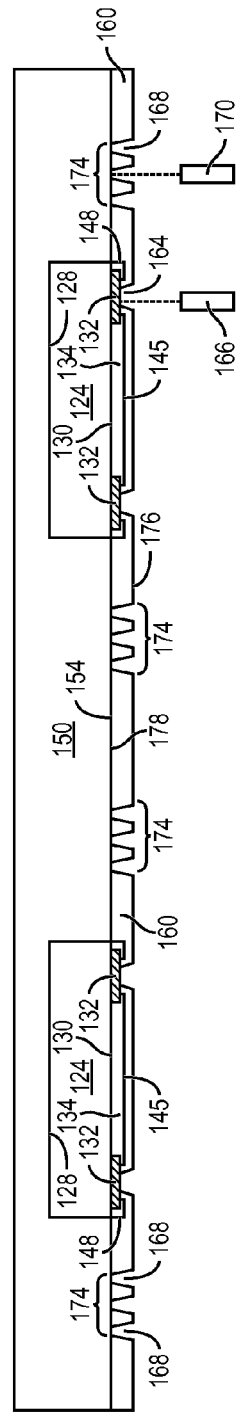

In FIG. 4g, a portion of insulating layer 160 is removed by an etching process with a patterned photoresist layer to create vias or openings 164 to expose conductive layer 132. Alternatively, a portion of insulating layer 160 is removed by LDA using laser 166 to create vias 164 to expose conductive layer 132. Additionally, a portion of insulating layer 160 outside a footprint of semiconductor die 124 is removed by an etching process with a patterned photoresist layer to create micro vias or openings 168. Alternatively, a portion of insulating layer 160 is removed by LDA using laser 170 to create micro vias 168.

Micro vias 168 can have a straight, sloped, stepped, or tapered sidewall. In one embodiment, micro vias 168 have a cross-sectional width or diameter ranging from 10-100 micrometers (μm). In another embodiment, micro vias 168 have a cross-sectional width or diameter ranging from 20-30 μm. A plurality of micro vias 168 are formed outside a footprint of semiconductor die 124 and in a peripheral region or area of semiconductor die 124 in an array or group of micro vias 168 to form a micro via array 174. Micro via array 174 contains one or more micro vias 168. Micro via array 174 extends from a first surface 176 of insulating layer 160 to a second surface 178 of insulating layer 160 opposite surface 176. Micro via array 174 exposes surface 154 of encapsulant 150 outside a footprint of semiconductor die 124.

Figure 4H:
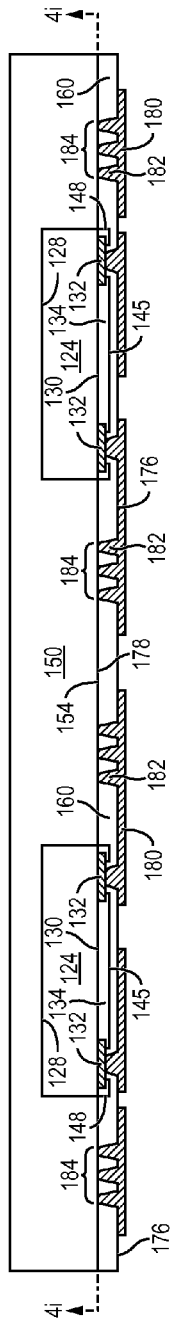

In FIG. 4h, an electrically conductive layer 180 is formed over insulating layer 160, encapsulant 150, and semiconductor die 124 using a patterning and metal deposition process, such as PVD, CVD, electrolytic plating, or electroless plating process. Conductive layer 180 can be one or more layers of Al, Cu, Sn, Ni, Au, Ag, or other suitable electrically conductive material. Individual portions of conductive layer 180 can be electrically common or electrically isolated according to the design and function of semiconductor die 124. A portion of conductive layer 180 extends through vias 164 to electrically connect conductive layer 180 to conductive layer 132. A portion of conductive layer 180 extends horizontally along insulating layer 160 and parallel to active surface 130 of semiconductor die 124 to laterally redistribute the electrical interconnect to conductive layer 132 of semiconductor die 124. Conductive layer 180 operates as a fan-out redistribution layer (RDL), providing lateral or horizontal redistribution for the electrical signals of semiconductor die 124.

A portion of conductive layer 180 also extends through micro vias 168 to form conductive micro vias 182. Conductive micro vias 182 extend from the horizontal portion of conductive layer 180, through insulating layer 160, to surface 154 of encapsulant 150. Conductive micro vias 182 can have straight, sloped, tapered, or stepped sidewalls. In one embodiment, conductive micro vias 182 have a generally conical shape with a generally circular cross-section. In another embodiment, conductive micro vias 182 have a generally cylindrical shape with a generally circular cross-section. In another embodiment, conductive micro vias 182 have a generally cubic shape with a generally rectangular cross-section. The shape of conductive micro vias 182 can vary according to the design and function of semiconductor die 124. In one embodiment, conductive micro vias 182 have a cross-sectional width or diameter ranging from 10-100 μm. In another embodiment, conductive micro vias 182 have a cross-sectional width or diameter ranging from 20-30 μm.

Conductive micro vias 182 are formed in a peripheral region or area of semiconductor die 124, outside a footprint of semiconductor die 124, as a group or array of multiple conductive micro vias 182 to form a conductive micro via array 184. Conductive micro vias 182, within conductive micro via array 184, form a series of peaks and valleys of conductive layer 180, providing a greater surface area for contact between conductive layer 180 and a subsequently formed conductive interconnect structure.

Figure 4I:
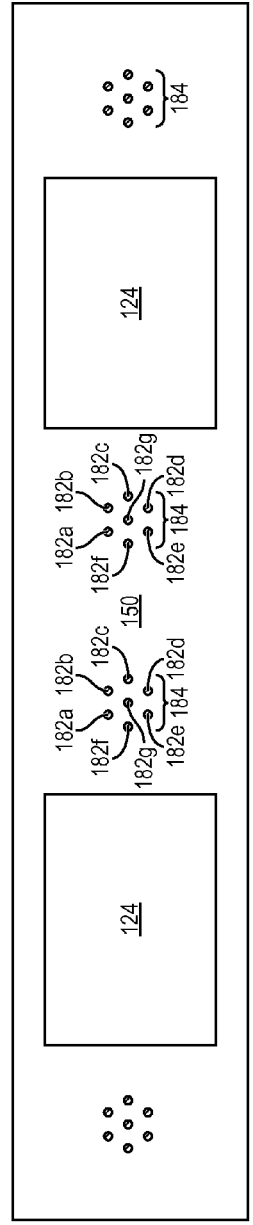

FIG. 4i shows a plan view of the assembly from FIG. 4h, from a plane that runs parallel to active surface 130 of semiconductor die 124 and the horizontal portion of conductive layer 180, along surface 178 of insulating layer 160, and surface 154 of encapsulant 150. A plurality of conductive micro vias 182a-182g are formed outside a footprint of semiconductor die 124 and extend through insulating layer 160 to encapsulant 150. In particular, conductive micro vias 182a-182f are formed in a generally circular or hexagonal shape or pattern around a central conductive micro via 182g. Conductive micro via 182g is centrally located relative to conductive micro vias 182a-182f. Conductive micro vias 182a-182f are positioned at the corners of a hexagon shape in a peripheral region of the central conductive micro via 182g. Each conductive micro via 182a-182f is an equal distance from conductive micro via 182g. Conductive micro vias 182a-182f are also an equal distance from each adjacent conductive micro via 182a-182f.

Figure 4J:
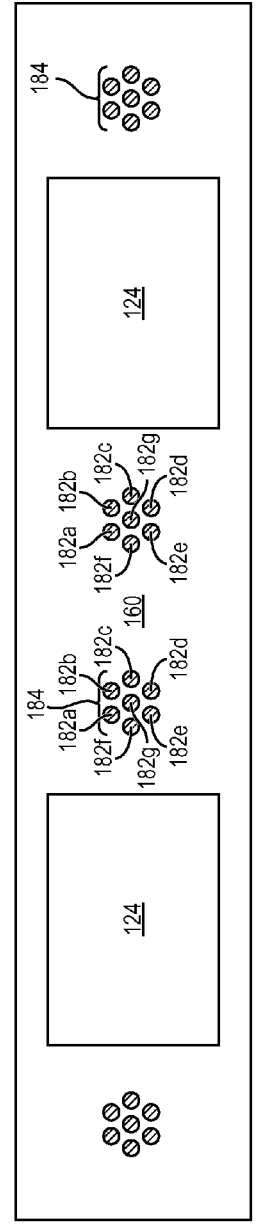

Collectively, conductive micro vias 182a-182g constitute conductive micro via array 184. In one embodiment, conductive micro via array 184 has fewer or additional conductive micro vias 182, according to the design and function of semiconductor die 124. In another embodiment, conductive micro vias 182 are arranged in different patterns or arrangements within conductive micro via array 184, for example, columns or rows of multiple conductive micro vias 182. FIG. 4j shows a plan view of the assembly from FIG. 4h, from a plane that runs parallel to active surface 130 of semiconductor die 124 along surface 176 of insulating layer 160, along active surface 130 of semiconductor die 124, and continuing again along surface 176 of insulating layer 160. Conductive micro vias 182a-182g have a larger cross-sectional width than in FIG. 4i, reflecting an embodiment in which conductive micro vias 182a-182g have tapered sidewalls. In another embodiment, conductive micro vias 182 have straight or stepped sidewalls.

Figure 4K:
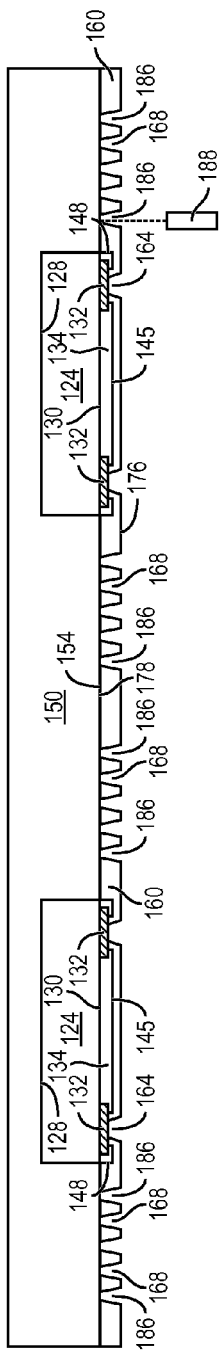

FIG. 4k illustrates another embodiment, with a trench 186 formed around micro vias 168 prior to depositing conductive layer 180. Continuing from FIG. 4g, a portion of insulating layer 160 between or outside a footprint of semiconductor die 124, and around a perimeter of micro via array 174, is removed by an etching process with a patterned photoresist layer to create trench 186. Alternatively, a portion of insulating layer 160 is removed by LDA using laser 188 to create trench 186. Trench 186 can have a straight, sloped, stepped, or tapered sidewall. A footprint of trench 186 can vary in shape, according to the design and function of semiconductor die 124. For example, the footprint of trench 186 can be generally circular or rectangular around micro vias 168.

Figure 4L:
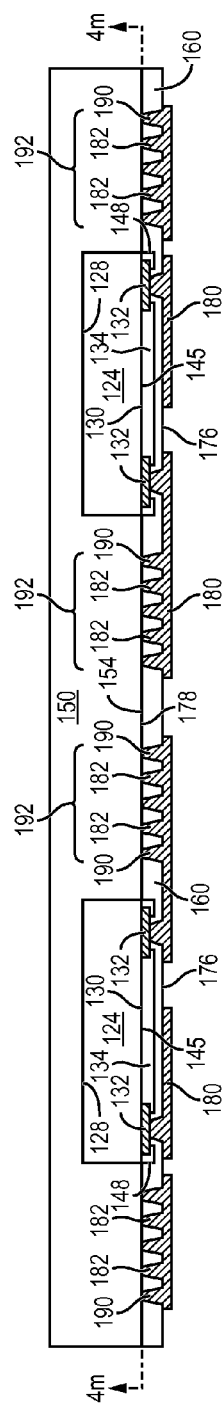

In FIG. 4l, conductive layer 180 is formed over insulating layer 160, encapsulant 150, and semiconductor die 124 using a patterning and metal deposition process, such as PVD, CVD, electrolytic plating, or electroless plating process. Conductive layer 180 can be one or more layers of Al, Cu, Sn, Ni, Au, Ag, or other suitable electrically conductive material. Individual portions of conductive layer 180 can be electrically common or electrically isolated according to the design and function of semiconductor die 124. A portion of conductive layer 180 extends through vias 164 to electrically connect conductive layer 180 to conductive layer 132. A portion of conductive layer 180 extends horizontally along insulating layer 160 and parallel to active surface 130 of semiconductor die 124 to laterally redistribute the electrical interconnect to conductive layer 132 of semiconductor die 124. Conductive layer 180 operates as a fan-out RDL, providing lateral or horizontal redistribution for the electrical signals of semiconductor die 124.

A portion of conductive layer 180 extends through micro vias 168 to form conductive micro vias 182. A portion of conductive layer 180 extends through trench 186 to form conductive ring 190. Conductive micro vias 182 and conductive ring 190 extend from the horizontal portion of conductive layer 180, to surface 154 of encapsulant 150. Conductive micro vias 182 and conductive ring 190 can have straight, sloped, tapered, or stepped sidewalls. In one embodiment, conductive micro vias 182 have a generally conical shape with a generally circular cross-section. In another embodiment, conductive micro vias 182 have a generally cylindrical shape with a generally circular cross-section. The shape of conductive micro vias 182 can vary according to the design and function of semiconductor die 124. In one embodiment, conductive micro vias 182 have a cross-sectional width or diameter ranging from 10-100 µm. In another embodiment, conductive micro vias 182 have a cross-sectional width or diameter ranging from 20-30 µm. Conductive micro vias 182 are formed in a peripheral region or area of semiconductor die 124, outside a footprint of semiconductor die 124, as a group or array of multiple conductive micro vias 182 surrounded by conductive ring 190 to form conductive micro via array 192. Conductive micro vias 182 and conductive ring 190, within conductive micro via array 192, constitute a series of peaks and valleys of conductive layer 180, providing a greater surface area for contact between conductive layer 180 and a subsequently formed conductive interconnect structure.

Figure 4M:
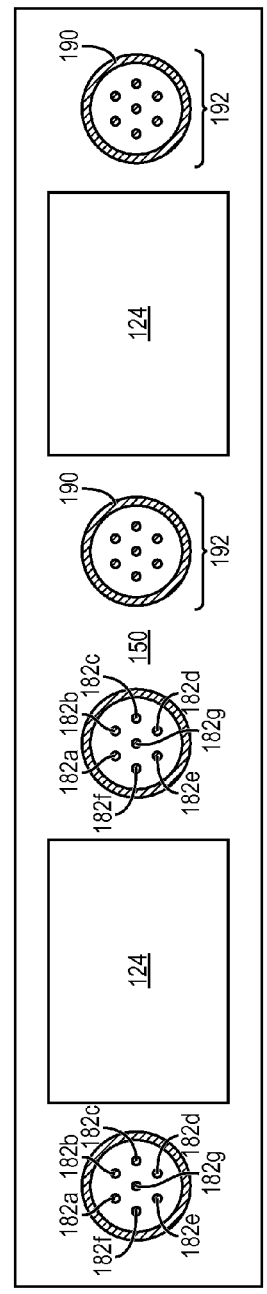

FIG. 4m shows a top or plan view of the assembly from FIG. 4l, from a plane that runs parallel to active surface 130 of semiconductor die 124 and the horizontal portion of conductive layer 180, along surface 178 of insulating layer 160, and surface 154 of encapsulant 150. A plurality of conductive micro vias 182a-182g are formed outside a footprint of semiconductor die 124 and extend through insulating layer 160 to encapsulant 150. In particular, conductive micro vias 182a-182f are formed in a generally circular or hexagonal shape or pattern around a central conductive micro via 182g. Conductive micro via 182g is centrally located relative to conductive micro vias 182a-182f. Each conductive micro via 182a-182f is an equal distance from conductive micro via 182g. Conductive micro vias 182a-182f are positioned at the corners of a hexagon in a peripheral region of the central conductive micro via 182g. Conductive micro vias 182a-182f are an equal distance from each adjacent conductive micro via 182a-182f. Conductive ring 190 is formed around conductive micro vias 182a-182g, in a peripheral area of conductive micro vias 182a-182g. Conductive ring 190 has a footprint that is generally circular, with conductive micro via 182g at the center of conductive ring 190 and conductive micro vias 182a-182f an equal distance from conductive ring 190. The shape of conductive ring 190 can vary according to the design and function of semiconductor die 124.

Figure 4N:
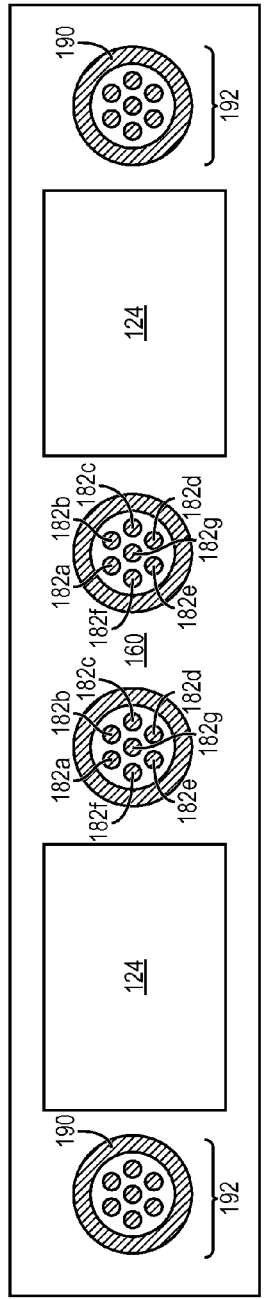

Conductive micro vias 182a-182g and conductive ring 190 constitute a conductive micro via array 192. In one embodiment, conductive micro via array 192 has fewer or additional conductive micro vias 182, according to the design and function of semiconductor die 124. In another embodiment, conductive micro vias 182 are arranged in different patterns or arrangements within conductive micro via array 192, for example, columns or rows of multiple conductive micro vias 182. FIG. 4n shows a plan view of the assembly from FIG. 4m, from a plane that runs parallel to active surface 130 of semiconductor die 124 along surface 176 of insulating layer 160, along active surface 130 of semiconductor die 124, and continuing again along surface 176 of insulating layer 160. Conductive micro vias 182a-182g and conductive ring 190 have a larger cross-sectional width than in FIG. 4m, reflecting an embodiment in which conductive micro vias 182a-182g and conductive ring 190 have tapered sidewalls. In another embodiment, conductive micro vias 182a-182g and conductive ring 190 have straight, sloped, curved, or stepped sidewalls.

Figure 4O:
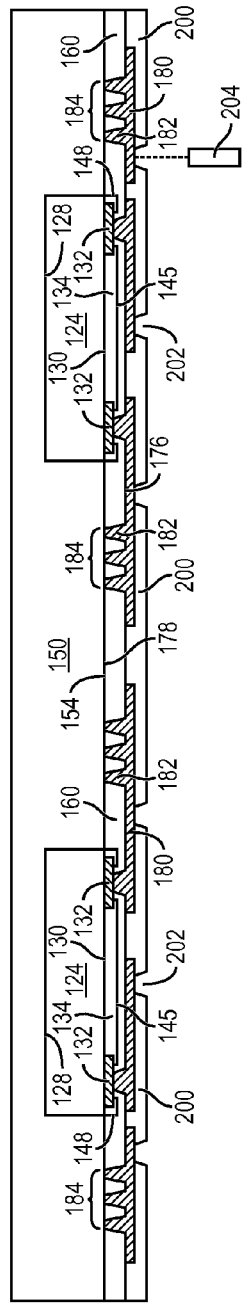

Continuing from FIG. 4h, an insulating or passivation layer 200 is formed over conductive layer 180 and insulating layer 160 using PVD, CVD, printing, spin coating, spray coating, screen printing or lamination, as shown in FIG. 4o. Insulating layer 200 contains one or more layers of photosensitive polymer dielectric film with or without fillers, non-photosensitive polymer dielectric film, SiO2, Si3N4, SiON, Ta2O5, Al2O3, or other material having similar insulating and structural properties. A portion of insulating layer 200 is removed by an etching process with a patterned photoresist layer to create vias or openings 202 and to expose conductive layer 180. Alternatively, a portion of insulating layer 200 is removed by LDA using laser 204 to create vias 202 and to expose conductive layer 180. Insulating layer 200 can have a thickness equal to, less than, or greater than a thickness of insulating layer 160, according to the design and function of semiconductor die 124.

Figure 4P:
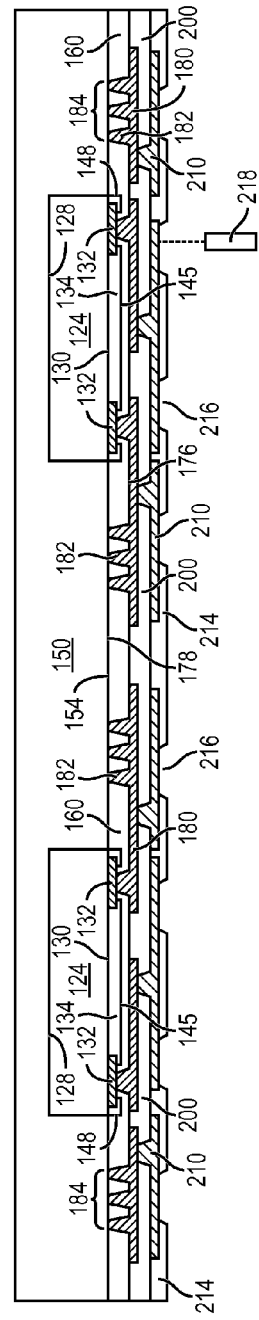

In FIG. 4p, an electrically conductive layer 210 is formed over insulating layer 200 and conductive layer 180 using patterning with PVD, CVD, sputtering, electrolytic plating, electroless plating process, or other suitable metal deposition process. Conductive layer 210 can be one or more layers of Al, Cu, Sn, Ni, Au, Ag, or other suitable electrically conductive material. Conductive layer 210 is electrically connected to conductive layer 180. A portion of conductive layer 210 extends horizontally along insulating layer 200 and parallel to active surface 130 of semiconductor die 124 to laterally redistribute the electrical interconnect to conductive layer 180. Conductive layer 210 operates as a fan-out RDL for the electrical signals of semiconductor die 124. Other portions of conductive layer 210 are electrically common or electrically isolated depending on the connectivity of semiconductor die 124.

An insulating or passivation layer 214 is formed over insulating layer 200 and conductive layer 210 using PVD, CVD, printing, spin coating, spray coating, screen printing or lamination. Insulating layer 214 contains one or more layers of photosensitive polymer dielectric film with or without fillers, non-photosensitive polymer dielectric film, $SiO_2$, $Si_3N_4$, SiON, $Ta_2O_5$, $Al_2O_3$, or other material having similar insulating and structural properties. A portion of insulating layer 214 is removed by an etching process with a patterned photoresist layer to create openings 216 and to expose conductive layer 210. Alternatively, a portion of insulating layer 214 is removed by LDA using laser 218 to create openings 216 and to expose conductive layer 210. The thickness and material of insulating layer 214 can vary according to the design and function of semiconductor die 124. The thickness of insulating layer 214 can be less than or equal to the thickness of insulating layer 160. Alternatively, the thickness of insulating layer 214 can be greater than the thickness of insulating layer 160 to provide additional structural support, balance, stress relief, and warpage control to the package.

In FIG. 4q, an electrically conductive bump material is deposited over the exposed conductive layer 210 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 210 using a suitable attachment or bonding process. In one embodiment, the bump material is reflowed by heating the material above its melting point to form balls or bumps 220. In some applications, bumps 220 are reflowed a second time to improve electrical contact to conductive layer 210. An under bump metallization (UBM) layer can be formed under bumps 220. Bumps 220 can also be compression bonded to conductive layer 210. Bumps 220 represent one type of conductive interconnect structure that can be formed over conductive layer 210. The interconnect structure can also use stud bump, micro bump, or other electrical interconnect.

Collectively, insulating layers 160, 200, and 214, conductive layers 180 and 210, and bumps 220 constitute a build-up interconnect structure 224 formed over semiconductor die 124 and encapsulant 150 with conductive micro via array 184 formed outside a footprint of semiconductor die 124. Additional insulating layers and RDLs can be formed over insulating layer 214 prior to forming bumps 220, to provide additional vertical and horizontal electrical connectivity across the package according to the design and functionality of semiconductor die 124.

In FIG. 4r, back grinding tape 230 is applied over semiconductor die 124, encapsulant 150, and build-up interconnect structure 224 using lamination or other suitable application process. Back grinding tape 230 contacts insulating layer 214 and bumps 220. Back grinding tape 230 follows the contours of a surface of bumps 220 and extends around and between bumps 220. Back grinding tape 230 includes tapes with thermal resistance up to 270° C. Back grinding tape 230 also includes tapes with a thermal release function. Examples of back grinding tape 230 include UV tape HT 440 and non-UV tape MY-595. Back grinding tape 230 provides structural support for subsequent back grinding and removal of a portion of encapsulant 150 from a backside surface 232 of encapsulant 150, opposite build-up interconnect structure 224.

Backside surface 232 of encapsulant 150 undergoes a grinding operation with grinder 234 to planarize and reduce a thickness of encapsulant 150. A chemical etch can also be used to remove and planarize encapsulant 150. After the grinding operation is completed, back surface 128 of semiconductor die 124 is exposed. A thickness of semiconductor die 124 can also be reduced by the grinding operation. Alternatively, a thickness of encapsulant 150 maintains coverage over back surface 128 of semiconductor die 124. After the grinding operation, encapsulant 150 has a thickness T1, measured from surface 154 of encapsulant 150 to exposed backside surface 236 of encapsulant 150. In one embodiment, thickness T1 of encapsulant 150 is between 100-250 µm. Back grinding tape 230 can be actively cooled during the grinding operation.

In FIG. 4s, a portion of encapsulant 150 is removed in a peripheral region of semiconductor die 124, over conductive micro via array 184, to form openings 240. Openings 240 are formed by drilling, high energy water jetting, an etching process with a patterned photoresist layer, or other suitable process. Alternatively, a portion of encapsulant 150 is removed in a peripheral region of semiconductor die 124 over conductive micro via array 184 by LDA using laser 241 to form openings 240. Openings 240 have a vertical or sloped sidewall 242 and extend from backside surface 236 of encapsulant 150, partially through encapsulant 150, to a recessed surface 244 of encapsulant 150. Openings 240 constitute a through-mold-hole (TMH) and extend partially through encapsulant 150. In one embodiment, openings 240 have a cross-sectional width ranging from 180-450 µm. After forming openings 240, encapsulant 150 has a thickness T2, smaller than thickness T1, measured from surface 154 of encapsulant 150 to recessed surface 244 of encapsulant 150, within a footprint of openings 240. In one embodiment, thickness T2 of encapsulant 150 is between 20-50 µm.

In FIG. 4t, a portion of encapsulant 150 and insulating layer 160 is removed within a footprint of openings 240, in a peripheral region of semiconductor die 124, and over conductive micro via array 184, to form openings 250 and to expose conductive layer 180 and conductive micro via array 184. Openings 250 are formed by drilling, high energy water jetting, an etching process with a patterned photoresist layer, or other suitable process. Alternatively, a portion of encapsulant 150 is removed within a footprint of openings 240, in a peripheral region of semiconductor die 124, and over conductive micro via array 184 by LDA using laser 252 to form openings 250. Openings 250 include a vertical or sloped sidewall 254 and extend through encapsulant 150 and insulating layer 160, from recessed surface 244 to conductive layer 180. Openings 250 constitute a TMH and extend from recessed surface 244 of encapsulant 150, through insulating layer 160, to conductive layer 180. Openings 250 have a cross-sectional width less than the cross-sectional width of openings 240. In one embodiment, openings 250 have a cross-sectional width ranging from 50-150 µm.

Collectively, openings 240 and 250 constitute openings 260. Openings 260 have a stepped sidewall 262, resulting from the process of forming openings 250 with a smaller cross-sectional width than openings 240. Openings 260 have a first diameter or cross-sectional width within openings 250, ranging from 50-150 μm, and a second diameter or cross-sectional width within openings 240, ranging from 180-450 μm. Thus, openings 260 constitute a TMH with a step-through-hole structure. The step-through-hole structure increases structural support and reduces damage to the package, including build-up interconnect structure 224, during processing, for example, during a desmearing process, solder capping, or a package-on-package stack soldering process.

The assembly may be actively cooled during the formation of openings 260 to avoid stripping back grinding tape 230, and to minimize the thermal impact on semiconductor die 124. In another embodiment, the assembly is not actively cooled during the formation of openings 260, but the laser source or drilling sequence parameters are optimized to minimize thermal impact on semiconductor die 124.

The process of forming openings 260 further includes removing a portion of insulating layer 160 covering conductive micro via array 184. Thus, openings 260 expose conductive micro via array 184 and conductive micro vias 182 of conductive layer 180 through encapsulant 150. The exposed conductive micro via array 184 provides a greater exposed surface area for conductive layer 180 than if the exposed portion of conductive layer 180 were flat or planar. Conductive micro via array 184 thereby provides greater contact surface area between conductive layer 180 and subsequently deposited conductive bump material, for improved and more robust electrical and mechanical contact between subsequently deposited conductive bump material and conductive layer 180. Conductive micro vias 182 also increase the effective thickness of conductive layer 180 within a footprint of conductive micro via array 184 without significantly adding to the amount of conductive material within conductive layer 180.

FIG. 4u shows a top or plan view of the assembly from FIG. 4t. Openings 260 are formed in a peripheral region of semiconductor die 124 and extends from an exposed backside surface 236 of encapsulant 150, through encapsulant 150 and insulating layer 160, to conductive layer 180. Openings 260 constitute a TMH with a step-through-hole structure. Openings 260 expose conductive layer 180, with conductive micro vias 182a-182g forming conductive micro via array 184. Conductive micro vias 182a-182g form a series of peaks and valleys of conductive layer 180, which increases the surface area of conductive layer 180. Conductive micro via array 184 provides a greater exposed surface area of conductive layer 180 than if the exposed portion of conductive layer 180 were flat or planar. Thus, conductive micro via array 184 facilitates improved and more robust mechanical and electrical connection between conductive layer 180 and subsequently deposited conductive bump material.

In FIG. 4v, an electrically conductive bump material is deposited over the exposed conductive layer 180 and conductive micro vias 182 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form spherical balls or bumps 266. In some applications, bumps 266 are reflowed a second time to improve electrical contact to conductive layer 180. A UBM layer can be formed under bumps 266. The bumps can also be compression bonded to conductive layer 180.

Bumps 266 represent one type of conductive interconnect structure that can be formed over conductive layer 180. The conductive interconnect structure can also use bond wires, Cu, Ag, or other conductive paste, stud bump, micro bump, solder balls with a Cu core, Cu balls or columns with dipped solder paste or solder coating, or other electrical interconnect. Bumps 266 are formed over conductive layer 180 and over and between conductive micro vias 182 of conductive micro via array 184. Accordingly, a 3-D interconnection for next level interconnection is formed through bumps 266, conductive layer 180, build-up interconnect structure 224, and semiconductor die 124. The 3-D interconnection provides vertical electrical interconnection for semiconductor die 124 without a backside interconnect or RDL over a footprint of semiconductor die 124. Conductive micro vias 182 provide an increased contact surface area between conductive layer 180 and bumps 266 for improved and more robust mechanical and electrical connection between conductive layer 180 and bumps 266.

Back grinding tape 230 is removed after forming bumps 266. Alternatively, back grinding tape 230 is removed after completing the grinding operation of encapsulant 150, but before forming openings 260, and a supporting tape with high thermal conductivity and high heat resistance is applied over insulating layer 214 and bumps 220. Reconstituted wafer 143 can also be placed in a supporting jig, with a compliant top layer to avoid structural damage, prior to forming openings 260. The supporting jig has high thermal conductivity and an array of small vacuum holes to provide thermal protection and structural support for reconstituted wafer 143 during the formation of openings 260.

In FIG. 4w, the assembly from FIG. 4t is singulated through encapsulant 150, and insulating layers 160, 200, and 214 with saw blade or laser cutting tool 270 into individual Fo-WLCSPs 280.

FIG. 5 shows Fo-WLCSP 280 after singulation. Fo-WLCSP 280 provides 3-D electrical interconnection with a fan-out RDL and conductive micro via array 184 formed outside a footprint of a semiconductor die 124. An encapsulant 150 is deposited over semiconductor die 124. An insulating layer 160 is formed over active surface 130 of semiconductor die 124 and encapsulant 150. A conductive layer 180 is formed over insulating layer 160 and is electrically connected to conductive layer 132 of semiconductor die 124. A portion of conductive layer 180 extends horizontally along insulating layer 160 and parallel to active surface 130 of semiconductor die 124 to laterally redistribute the electrical interconnect to conductive layer 132 of semiconductor die 124. Conductive layer 180 operates as a fan-out RDL, providing lateral or horizontal redistribution for the electrical signals of semiconductor die 124. Conductive layer 180 has a conductive micro via array 184 formed outside a footprint of semiconductor die 124. Conductive micro via array 184 includes one or more conductive micro vias 182. Conductive micro via array 184 extends from the horizontal portion of conductive layer 180 through insulating layer 160 to surface 154 of encapsulant 150.

A portion of encapsulant 150 and insulating layer 160 is removed over conductive micro via array 184 to form openings 260, which constitute a TMH. Openings 260 have a first diameter or cross-sectional width ranging from 50-150 μm, and a second diameter or cross-sectional width ranging from 180-450 μm. Thus, openings 260 have a stepped sidewall 262, and openings 260 constitute a TMH with a step-through-hole structure. The step-through-hole structure increases structural support and reduces damage to the package, including build-up interconnect structure 224, during processing, for example, during a desmearing process, solder capping, or a package-on-package stack soldering process.

Openings 260 expose conductive micro via array 184 and conductive micro vias 182 of conductive layer 180. The exposed conductive micro via array 184 provides a greater exposed surface area for conductive layer 180 than if the exposed conductive layer 180 were flat or planar. The additional exposed surface area of conductive layer 180, resulting from conductive micro via array 184, provides for improved and more robust electrical and mechanical contact between subsequently deposited conductive bump material and conductive layer 180.

An electrically conductive bump material is deposited within openings 260 over conductive layer 180 to form bumps 266. Bumps 266 are formed over conductive layer 180 and over and between conductive micro vias 182 of conductive micro via array 184. Accordingly, a 3-D interconnection for next level interconnection is formed through bumps 266, conductive layer 180, build-up interconnect structure 224, and semiconductor die 124. The 3-D interconnection provides vertical electrical interconnection for semiconductor die 124 without a backside interconnect or RDL over a footprint of semiconductor die 124. Conductive micro vias 182 provide an increased contact surface area and improved and more robust mechanical and electrical connection between conductive layer 180 and bumps 266.

Figure 6A:
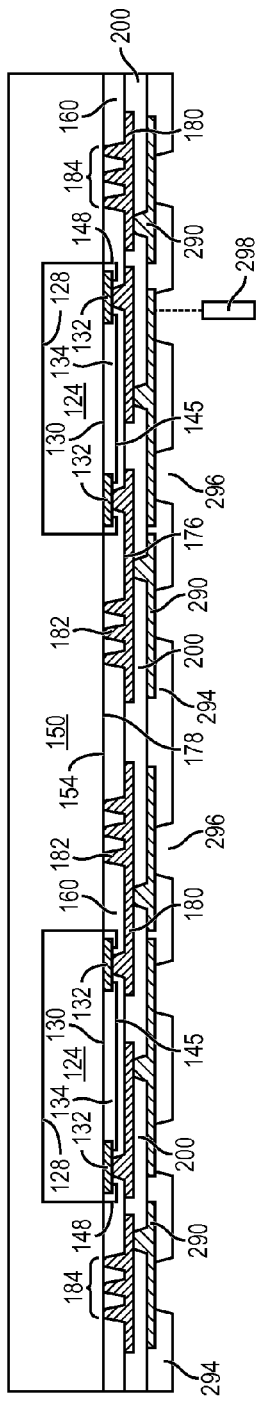

FIGS. 6a-6h illustrate, in relation to FIGS. 1, and 2a-2c, a process of forming a vertical interconnect structure for a 3-D Fo-WLCSP with a backside protection and balance layer. Continuing from FIG. 4m, an electrically conductive layer 290 is formed over insulating layer 200 and conductive layer 180 using patterning with PVD, CVD, sputtering, electrolytic plating, electroless plating process, or other suitable metal deposition process, as shown in FIG. 6a. Conductive layer 290 can be one or more layers of Al, Cu, Sn, Ni, Au, Ag, or other suitable electrically conductive material. Conductive layer 290 is electrically connected to conductive layer 180. A portion of conductive layer 290 extends horizontally along insulating layer 200 and parallel to active surface 130 of semiconductor die 124 to laterally redistribute the electrical interconnect to conductive layer 180. Conductive layer 290 operates as a fan-out RDL for the electrical signals of semiconductor die 124. Other portions of conductive layer 290 are electrically common or electrically isolated depending on the connectivity of semiconductor die 124.

An insulating or passivation layer 294 is formed over insulating layer 200 and conductive layer 290 using PVD, CVD, printing, spin coating, spray coating, screen printing or lamination. Insulating layer 294 contains one or more layers of photosensitive polymer dielectric film with or without fillers, non-photosensitive polymer dielectric film, SiO2, Si3N4, SiON, Ta2O5, Al2O3, or other material having similar insulating and structural properties. A portion of insulating layer 294 is removed by an etching process with a patterned photoresist layer to create openings 296 and to expose conductive layer 290. Alternatively, a portion of insulating layer 294 is removed by LDA using laser 298 to create openings 296 and to expose conductive layer 290. The thickness and material of insulating layer 294 can vary according to the design and function of semiconductor die 124. The thickness of insulating layer 294 can be less than or equal to the thickness of insulating layer 160. Alternatively, the thickness of insulating layer 294 can be greater than the thickness of insulating layer 160 to provide additional structural support, balance, stress relief, and warpage control to the package.

Figure 6B:
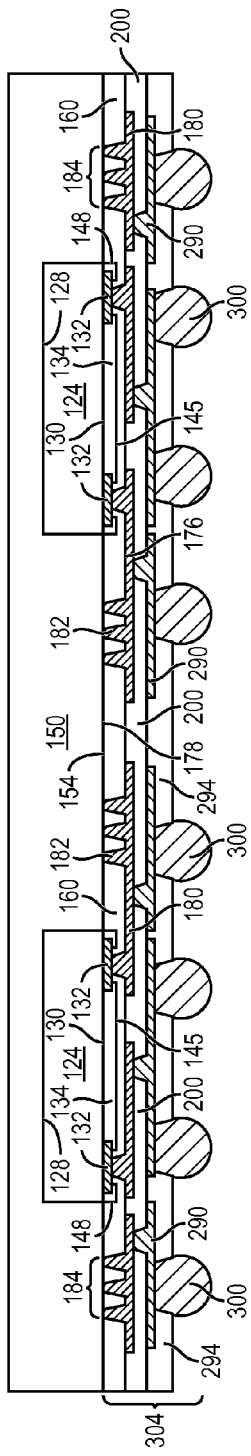

In FIG. 6b, an electrically conductive bump material is deposited over the exposed conductive layer 290 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 290 using a suitable attachment or bonding process. In one embodiment, the bump material is reflowed by heating the material above its melting point to form balls or bumps 300. In some applications, bumps 300 are reflowed a second time to improve electrical contact to conductive layer 290. A UBM layer can be formed under bumps 300. Bumps 300 can also be compression bonded to conductive layer 290. Bumps 300 represent one type of conductive interconnect structure that can be formed over conductive layer 290. The interconnect structure can also use stud bump, micro bump, or other electrical interconnect.

Collectively, conductive layers 180 and 290, insulating layers 160, 200, and 294, and bumps 300 comprise a build-up interconnect structure 304 formed over semiconductor die 124 and encapsulant 150. Additional insulating layers and RDLs can be formed over insulating layer 294 prior to forming bumps 300, to provide additional vertical and horizontal electrical connectivity across the package according to the design and functionality of semiconductor die 124.

Figure 6C:
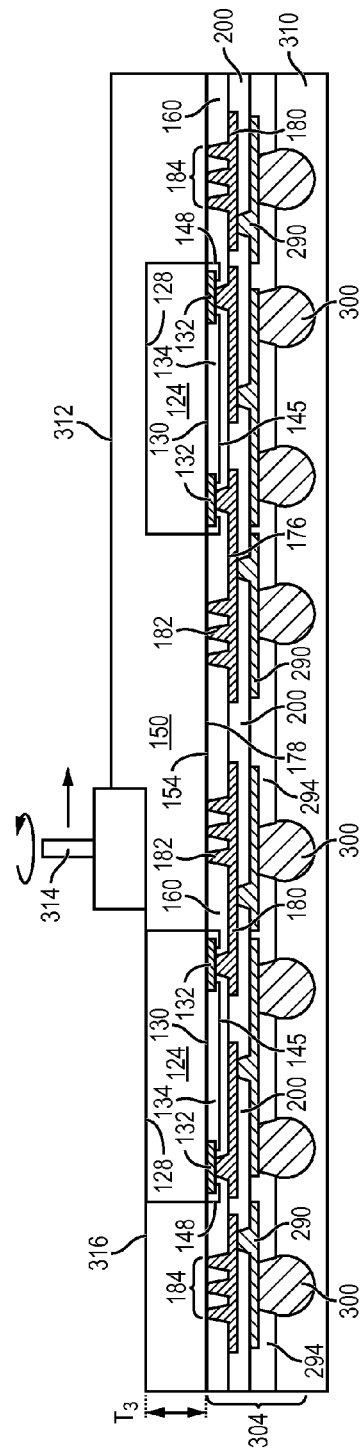

In FIG. 6c, back grinding tape 310 is applied over semiconductor die 124, encapsulant 150, and build-up interconnect structure 304 using lamination or other suitable application process. Back grinding tape 310 contacts insulating layer 294 and bumps 300. Back grinding tape 310 follows the contours of a surface of bumps 300 and extends around and between bumps 300. Back grinding tape 310 includes tapes with thermal resistance up to 270° C. Back grinding tape 310 also includes tapes with a thermal release function. Examples of back grinding tape 310 include UV tape HT 440 and non-UV tape MY-595. Back grinding tape 310 provides structural support for a subsequent grinding operation and removal of a portion of encapsulant 150 from a backside surface 312 of encapsulant 150, opposite build-up interconnect structure 304.

Backside surface 312 of encapsulant 150 undergoes a grinding operation with grinder 314 to planarize the surface and reduce a thickness of the encapsulant. A chemical etch can also be used to remove and planarize encapsulant 150. After the grinding operation is completed, back surface 128 of semiconductor die 124 is exposed. A thickness of semiconductor die 124 can also be reduced by the grinding operation. Alternatively, a thickness of encapsulant 150 maintains coverage over back surface 128 of semiconductor die 124. After the grinding operation, encapsulant 150 has a thickness T3, measured from surface 154 of encapsulant 150 to exposed backside surface 316 of encapsulant 150. Back grinding tape 310 can be actively cooled during the grinding operation.

In FIG. 6d, an insulating or passivation layer 318 is formed over exposed backside surface 316 of encapsulant 150 and back surface 128 of semiconductor 124 using PVD, CVD, printing, spin coating, spray coating, screen printing or lamination. Insulating layer 318 contains one or more layers of photosensitive polymer dielectric film with or without fillers, non-photosensitive polymer dielectric film, SiO2, Si3N4, SiON, Ta2O5, Al2O3, or other material having similar insulating and structural properties. Insulating layer 318 operates as a backside protection and balancing layer, providing environmental protection for the semiconductor device from external elements and contaminants. Additionally, insulating layer 318 provides structural support for the package, to balance stress on the package, and reduce warping or cracking of the package during subsequent handling and processing. Accordingly, in one embodiment, insulating layer 318 has a coefficient of thermal expansion (CTE) similar or equal to insulating layer 294, and encapsulant 150. Insulating layer 318 can have a thickness equal to, less than, or greater than a thickness of insulating layer 294, according to the design and function of semiconductor die 124. In one embodiment, insulating layer 318 has a thickness ranging from 20-75 μm.

In FIG. 6e, a portion of encapsulant 150 is removed in a peripheral region of semiconductor die 124, over conductive micro via array 184, to form openings 320. Openings 320 are formed by drilling, high energy water jetting, an etching process with a patterned photoresist layer, or other suitable process. Alternatively, a portion of encapsulant 150 is removed in a peripheral region of semiconductor die 124 over conductive micro via array 184 by LDA using laser 324 to form openings 320. Openings 320 have a vertical or sloped sidewall 326 and extend from backside surface 328 of insulating layer 318, partially through encapsulant 150, to a recessed surface 329 of encapsulant 150. Openings 320 constitute a TMH and extend partially through encapsulant 150. In one embodiment, openings 320 have a cross-sectional width ranging from 180-450 μm. After forming openings 320, encapsulant 150 has a thickness T4, smaller than thickness T3, measured from surface 154 of encapsulant 150 to recessed surface 329 of encapsulant 150, within a footprint of openings 320.

Figure 6F:
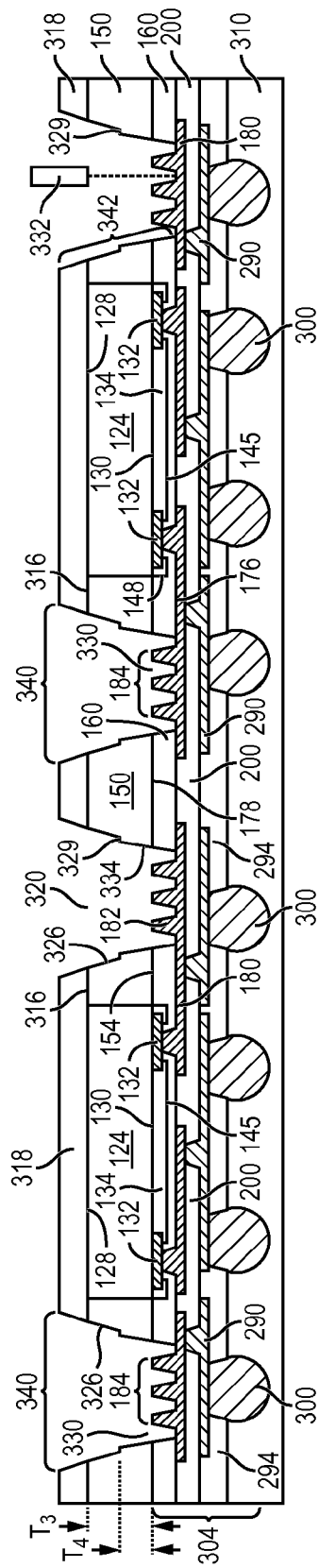

In FIG. 6f, a portion of encapsulant 150 and insulating layer 160 is removed within a footprint of openings 320, in a peripheral region of semiconductor die 124, and over conductive micro via array 184, to form openings 330 and to expose conductive layer 180 and conductive micro via array 184. Openings 330 are formed by drilling, high energy water jetting, an etching process with a patterned photoresist layer, or other suitable process. Alternatively, a portion of encapsulant 150 is removed within a footprint of openings 320, in a peripheral region of semiconductor die 124, and over conductive micro via array 184 by LDA using laser 332 to form openings 330. Openings 330 include a vertical or sloped sidewall 334 and extend through encapsulant 150 from recessed surface 329 to conductive layer 180. Openings 330 constitute a TMH and extend from recessed surface 329 of encapsulant 150, through insulating layer 160, to conductive layer 180. Openings 330 have a cross-sectional width less than the cross-sectional width of openings 320. In one embodiment, openings 330 have a cross-sectional width ranging from 50-150 μm.

Collectively, openings 320 and 330 constitute openings 340. Openings 340 have a stepped sidewall 342, resulting from the process of forming openings 330 with a smaller cross-sectional width than openings 320. Openings 340 have a first diameter or cross-sectional width within openings 330, ranging from 50-150 μm, and a second diameter or cross-sectional width within openings 320 ranging from 180-450 μm. Thus, openings 340 constitute a TMH with a step-through-hole structure. The step-through-hole structure increases structural support and reduces damage to the package, including build-up interconnect structure 304, during processing, for example, during a desmearing process, solder capping, or a package-on-package stack soldering process.

The assembly may be actively cooled during the formation of openings 340 to avoid stripping back grinding tape 310, and to minimize the thermal impact on semiconductor die 124. In another embodiment, the assembly is not actively cooled during the formation of openings 340, but the laser source or drilling sequence parameters are optimized to minimize thermal impact on semiconductor die 124.

The process of forming openings 340 further includes removing a portion of insulating layer 160 covering conductive micro via array 184. Thus, openings 340 expose conductive micro via array 184 and conductive micro vias 182 of conductive layer 180 through encapsulant 150. The exposed conductive micro via array 184 provides a greater exposed surface area for conductive layer 180 than if the exposed conductive layer 180 were flat or planar. Conductive micro via array 184 thereby provides greater contact surface area between conductive layer 180 and subsequently deposited conductive bump material, for improved and more robust electrical and mechanical contact between subsequently deposited conductive bump material and conductive layer 180. Conductive micro vias 182 also increase the effective thickness of conductive layer 180 within a footprint of conductive micro via array 184 without significantly adding to the amount of conductive material within conductive layer 180.

Figure 6G:
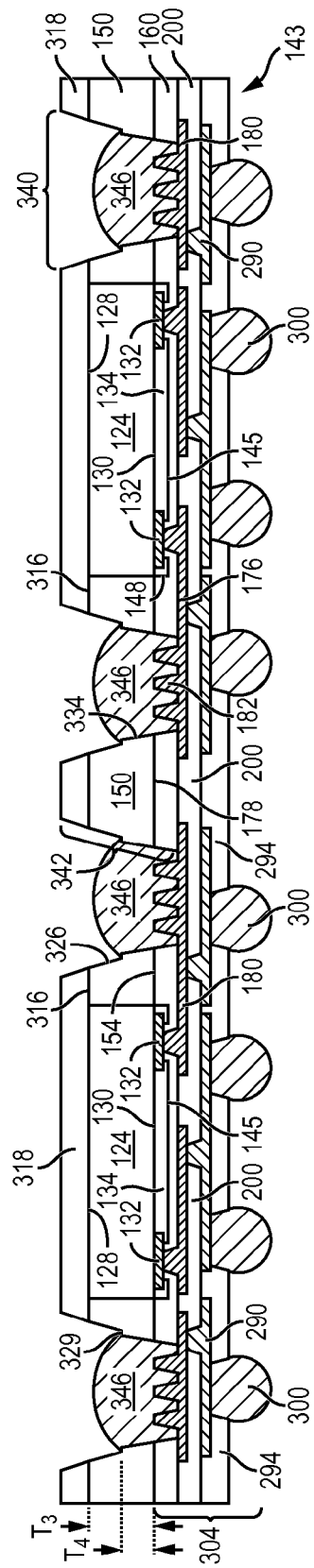

In FIG. 6g, an electrically conductive bump material is deposited over the exposed conductive layer 180 and conductive micro vias 182 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form spherical balls or bumps 346. In some applications, bumps 346 are reflowed a second time to improve electrical contact to conductive layer 180. A UBM layer can be formed under bumps 346. The bumps can also be compression bonded to conductive layer 180.

Bumps 346 represent one type of conductive interconnect structure that can be formed over conductive layer 180. The conductive interconnect structure can also use bond wires, Cu, Ag, or other conductive paste, stud bump, micro bump, solder balls with a Cu core, Cu balls or columns with dipped solder paste or solder coating, or other electrical interconnect. Bumps 346 are formed over conductive layer 180 and over and between conductive micro vias 182 of conductive micro via array 184. Accordingly, a 3-D interconnection for next level interconnection is formed through bumps 346, conductive layer 180, build-up interconnect structure 304, and semiconductor die 124. The 3-D interconnection provides vertical electrical interconnection without a backside interconnect or RDL formed over a footprint of semiconductor die 124. Conductive micro vias 182 provide an increased contact surface area between conductive layer 180 and bumps 346 for improved and more robust mechanical and electrical connection between conductive layer 180 and bumps 346.

Back grinding tape 310 is removed after forming bumps 346. Alternatively, back grinding tape 310 is removed after completing the back grinding of encapsulant 150, but before forming openings 340, and a supporting tape with high thermal conductivity and high heat resistance is applied over insulating layer 294 and bumps 300. Reconstituted wafer 143 can also be placed in a supporting jig, with a compliant top layer to avoid structural damage, prior to forming openings 340. The supporting jig has high thermal conductivity and an array of small vacuum holes to provide thermal protection and structural support for reconstituted wafer 143 during the formation of openings 340.

In FIG. 6h, the assembly from FIG. 6g is singulated through insulating layer 318, encapsulant 150, and insulating layers 160, 200, and 294 with saw blade or laser cutting tool 350 into individual Fo-WLCSPs 360.

FIG. 7 shows Fo-WLCSP 360 after singulation. Fo-WLCSP 360 provides 3-D electrical interconnection with a fan-out RDL and conductive micro via array 184 formed outside a footprint of a semiconductor die 124. An encapsulant 150 is deposited over semiconductor die 124. An insulating layer 160 is formed over active surface 130 of semiconductor die 124 and encapsulant 150. A conductive layer 180 is formed over insulating layer 160 and is electrically connected to conductive layer 132 of semiconductor die 124. A portion of conductive layer 180 extends horizontally along insulating layer 160 and parallel to active surface 130 of semiconductor die 124 to laterally redistribute the electrical interconnect to conductive layer 132 of semiconductor die 124. Conductive layer 180 operates as a fan-out RDL, providing lateral or horizontal redistribution for the electrical signals of semiconductor die 124. Conductive layer 180 has a conductive micro via array 184 formed outside a footprint of semiconductor die 124. Conductive micro via array 184 includes one or more conductive micro vias 182. Conductive micro via array 184 extends from the horizontal portion of conductive layer 180 through insulating layer 160 to surface 154 of encapsulant 150.

An insulating layer 318 is formed over backside surface 316 of encapsulant 150 and back surface 128 of semiconductor die 124. Insulating layer 318 operates as a backside protection and balancing layer, providing environmental protection for the semiconductor device from external elements and contaminants. Additionally, insulating layer 318 provides structural support for the package, to balance stress on the package, and reduce warping or cracking of the package during subsequent handling and processing. Accordingly, in one embodiment, insulating layer 318 has a CTE similar or equal to insulating layer 294, and encapsulant 150.

A portion of encapsulant 150 and insulating layers 160 and 318 is removed over conductive micro via array 184 to form openings 340, which constitute a TMH. Openings 340 have a first diameter or cross-sectional width ranging from 50-150 μm, and a second diameter or cross-sectional width ranging from 180-450 μm. Thus, openings 340 have a stepped sidewall 342, and openings 340 constitute a TMH with a step-through-hole structure. The step-through-hole structure increases structural support and reduces damage to the package, including build-up interconnect structure 304, during processing, for example, during a desmearing process, solder capping, or a package-on-package stack soldering process.

Openings 340 expose conductive micro via array 184 and conductive micro vias 182 of conductive layer 180 through encapsulant 150. The exposed conductive micro via array 184 provides a greater exposed surface area for conductive layer 180 than would be exposed if the exposed conductive layer 180 were flat or planar. Conductive micro via array 184 thereby provides greater contact surface area between conductive layer 180 and subsequently deposited conductive bump material than if the exposed portion of conductive layer 180 were flat or planar. The additional exposed surface area of conductive layer 180, resulting from conductive micro via array 184, provides for improved and more robust electrical and mechanical contact between subsequently deposited conductive bump material and conductive layer 180.

An electrically conductive bump material is deposited within openings 340 over conductive layer 180 to form bumps 346. Bumps 346 are formed over conductive layer 180 and over and between conductive micro vias 182 of conductive micro via array 184. Accordingly, a 3-D interconnection for next level interconnection is formed through bumps 346, conductive layer 180, build-up interconnect structure 304, and semiconductor die 124. The 3-D interconnection provides horizontal and vertical electrical interconnection for semiconductor die 124 without a backside interconnect or RDL over a footprint of semiconductor die 124. Conductive micro vias 182 provide an increased contact surface area and improved and more robust mechanical and electrical connection between conductive layer 180 and bumps 346.

Figure 8A:
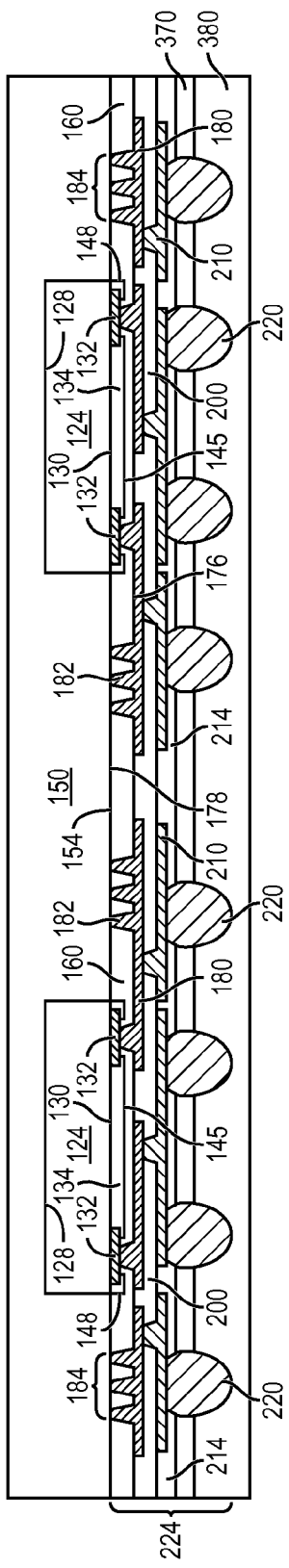

FIGS. 8a-8g illustrate, in relation to FIGS. 1, and 2a-2c, a process of forming a vertical interconnect structure for a 3-D Fo-WLCSP with front-side and backside protection and balance layers. Continuing from FIG. 4q, an insulating or passivation layer 370 is formed over and around bumps 220 and insulating layer 214 using PVD, CVD, printing, spin coating, spray coating, screen printing or lamination, as shown in FIG. 8a. Insulating layer 370 contains one or more layers of photosensitive polymer dielectric film with or without fillers, non-photosensitive polymer dielectric film, SiO2, Si3N4, SiON, Ta2O5, Al2O3, or other material having similar insulating and structural properties. Insulating layer 370 operates as a front-side protection, supporting, and balancing layer, providing environmental protection for the semiconductor device from external elements and contaminants. Additionally, insulating layer 370 provides structural support for the package, balancing stress on the package, and reducing warping or cracking of the package. Accordingly, in one embodiment, insulating layer 370 has a CTE similar or equal to insulating layer 214, and encapsulant 150. Insulating layer 318 can have a thickness equal to, less than, or greater than a thickness of insulating layer 214, according to the design and function of semiconductor die 124. In one embodiment, insulating layer 370 has a thickness ranging from 10-100 μm.

Back grinding tape 380 is applied over insulating layer 370 and build-up interconnect structure 224. Back grinding tape 380 contacts insulating layer 370 and bumps 220. Back grinding tape 380 follows the contours of a surface of bumps 220 and extends around and between bumps 220. Back grinding tape 380 includes tapes with thermal resistance up to 270° C. Back grinding tape 380 also includes tapes with a thermal release function. Examples of back grinding tape 380 include UV tape HT 440 and non-UV tape MY-595. In one embodiment, insulating layer 370 is incorporated into and applied with back grinding tape 380, and insulating layer 370 remains in place after subsequent removal of back grinding tape 380. Back grinding tape 380 provides structural support for a subsequent grinding operation and removal of a portion of encapsulant 150 from a backside surface 382 of encapsulant 150, opposite build-up interconnect structure 224.

Figure 8B:
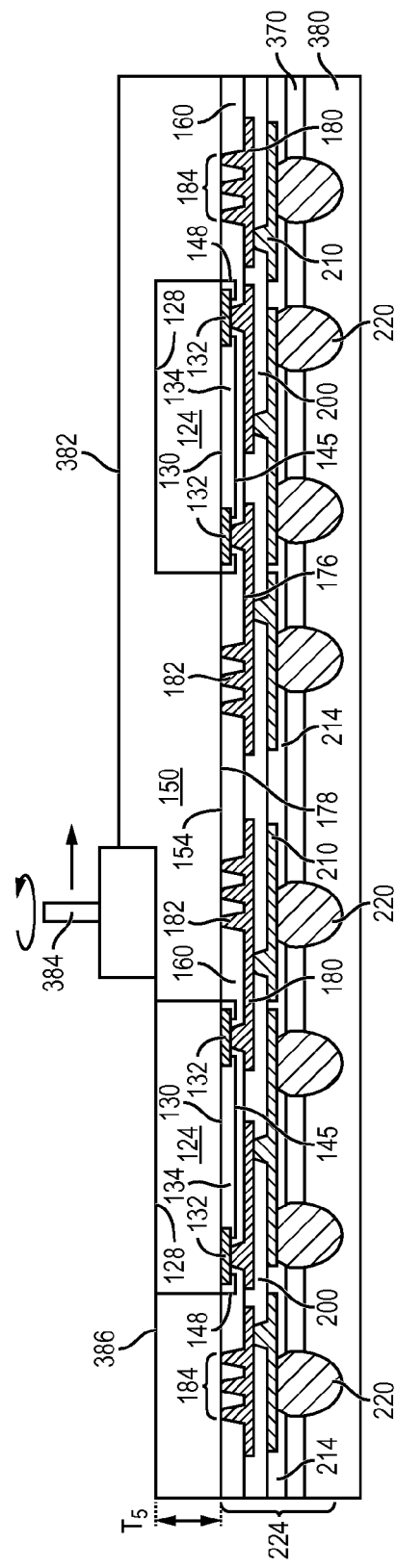

In FIG. 8b, backside surface 382 of encapsulant 150 undergoes a grinding operation with grinder 384 to planarize and reduce a thickness of encapsulant 150. A chemical etch can also be used to remove and planarize encapsulant 150. After the grinding operation is completed, back surface 128 of semiconductor die 124 is exposed. A thickness of semiconductor die 124 can also be reduced by the grinding operation. Alternatively, a thickness of encapsulant 150 maintains coverage over back surface 128 of semiconductor die 124. After the grinding operation, encapsulant 150 has a thickness T5, measured from surface 154 of encapsulant 150 to exposed backside surface 386 of encapsulant 150. Back grinding tape 380 can be actively cooled during the grinding operation.

In FIG. 8c, an insulating or passivation layer 388 is formed over exposed backside surface 386 of encapsulant 150 and back surface 128 of semiconductor 124 using PVD, CVD, printing, spin coating, spray coating, screen printing or lamination. Insulating layer 388 contains one or more layers of photosensitive polymer dielectric film with or without fillers, non-photosensitive polymer dielectric film, SiO2, Si3N4, SiON, Ta2O5, Al2O3, or other material having similar insulating and structural properties. Insulating layer 388 operates as a backside protection and balancing layer, providing environmental protection for the semiconductor device from external elements and contaminants. Additionally, insulating layer 388 provides structural support for the package, to balance stress on the package, and reduce warping or cracking of the package during subsequent handling and processing. Accordingly, in one embodiment, insulating layer 388 has a CTE similar or equal to insulating layer 370, and encapsulant 150. Insulating layer 388 can have a thickness equal to, less than, or greater than a thickness of insulating layer 370, according to the design and function of semiconductor die 124. In one embodiment, insulating layer 388 has a thickness ranging from 20-75 μm.

In FIG. 8d, a portion of encapsulant 150 and insulating layer 388 is removed in a peripheral region of semiconductor die 124, over conductive micro via array 184, to form openings 390. Openings 390 are formed by drilling, high energy water jetting, an etching process with a patterned photoresist layer, or other suitable process. Alternatively, a portion of encapsulant 150 is removed in a peripheral region of semiconductor die 124, over conductive micro via array 184 by LDA using laser 394 to form openings 390. Openings 390 have a vertical or sloped sidewall 396 and extend from a backside surface 398 of insulating layer 388, partially through encapsulant 150, to a recessed surface 399. Openings 390 constitute a TMH that extends partially through encapsulant 150. In one embodiment, openings 390 have a cross-sectional width ranging from 180-450 μm. After forming openings 390, encapsulant 150 has a thickness T6, smaller than thickness T5, measured from surface 154 of encapsulant 150 to recessed surface 399 of encapsulant 150, within a footprint of openings 390.

In FIG. 8e, a portion of encapsulant 150 and insulating layer 160 is removed within a footprint of openings 390, in a peripheral region of semiconductor die 124, and over conductive micro via array 184, to form openings 400 and to expose conductive layer 180 and conductive micro via array 184. Openings 400 are formed by drilling, high energy water jetting, an etching process with a patterned photoresist layer, or other suitable process. Alternatively, a portion of encapsulant 150 and insulating layers 160 and 388 is removed within a footprint of openings 390, in a peripheral region of semiconductor die 124, and over conductive micro via array 184 by LDA using laser 402 to form openings 400. Openings 400 include a vertical or sloped sidewall 404 and extend through encapsulant 150 from recessed surface 399 to conductive layer 180. Openings 400 constitute a TMH and extend from recessed surface 399, through insulating layer 160, to conductive layer 180. Openings 400 have a cross-sectional width less than the cross-sectional width of openings 390. In one embodiment, openings 400 have a cross-sectional width ranging from 50-150 μm.

Collectively, openings 390 and 400 constitute openings 410. Openings 410 have a stepped sidewall 412, resulting from the process of forming openings 400 with a smaller cross-sectional width than openings 390. Openings 410 have a first diameter or cross-sectional width within openings 400, ranging from 50-150 μm, and a second diameter or cross-sectional width within openings 390 ranging from 180-450 μm. Thus, openings 410 constitute a TMH with a step-through-hole structure. The step-through-hole structure increases structural support and reduces damage to the package, including build-up interconnect structure 224, during processing, for example, during a desmearing process, solder capping, or a package-on-package stack soldering process.

The assembly may be actively cooled during the formation of openings 410 to avoid stripping back grinding tape 380, and to minimize the thermal impact on semiconductor die 124. In another embodiment, the assembly is not actively cooled during the formation of openings 410, but the laser source or drilling sequence parameters are optimized to minimize thermal impact on semiconductor die 124.

The process of forming openings 410 further includes removing a portion of insulating layer 160 covering conductive micro via array 184. Thus, openings 410 expose conductive micro via array 184 and conductive micro vias 182 of conductive layer 180 through encapsulant 150. The exposed conductive micro via array 184 provides a greater exposed surface area for conductive layer 180 than if the exposed conductive layer 180 were flat or planar. Conductive micro via array 184 thereby provides greater contact surface area between conductive layer 180 and subsequently deposited conductive bump material, for improved and more robust electrical and mechanical contact between subsequently deposited conductive bump material and conductive layer 180. Conductive micro vias 182 also increase the effective thickness of conductive layer 180 within a footprint of conductive micro via array 184 without significantly adding to the amount of conductive material within conductive layer 180.

In FIG. 8f, an electrically conductive bump material is deposited over conductive layer 180 and conductive micro vias 182 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form spherical balls or bumps 416. In some applications, bumps 416 are reflowed a second time to improve electrical contact to conductive layer 180. A UBM layer can be formed under bumps 416. The bumps can also be compression bonded to conductive layer 180.

Bumps 416 represent one type of conductive interconnect structure that can be formed over conductive layer 180. The conductive interconnect structure can also use bond wires, Cu, Ag, or other conductive paste, stud bump, micro bump, solder balls with a Cu core, Cu balls or columns with dipped solder paste or solder coating, or other electrical interconnect. Bumps 416 are formed over conductive layer 180 and over and between conductive micro vias 182 of conductive micro via array 184. Accordingly, a 3-D interconnection is formed through bumps 416, conductive layer 180, build-up interconnect structure 224, and semiconductor die 124. The 3-D interconnection provides horizontal and vertical electrical interconnection for semiconductor die 124 without a backside interconnect or RDL over a footprint of semiconductor die 124. Conductive micro vias 182 provide an increased contact surface area between conductive layer 180 and bumps 416 for improved and more robust mechanical and electrical connection between conductive layer 180 and bumps 346.

Back grinding tape 380 is removed after forming bumps 416. Alternatively, back grinding tape 380 is removed after completing the grinding operation of encapsulant 150, but before forming openings 410, and a supporting tape with high thermal conductivity and high heat resistance is applied over insulating layer 370 and bumps 220. Reconstituted wafer 143 can also be placed in a supporting jig, with a compliant top layer to avoid structural damage, prior to forming openings 410. The supporting jig has high thermal conductivity and an array of small vacuum holes to provide thermal protection and structural support for reconstituted wafer 143 during the formation of openings 410.

Figure 8G:
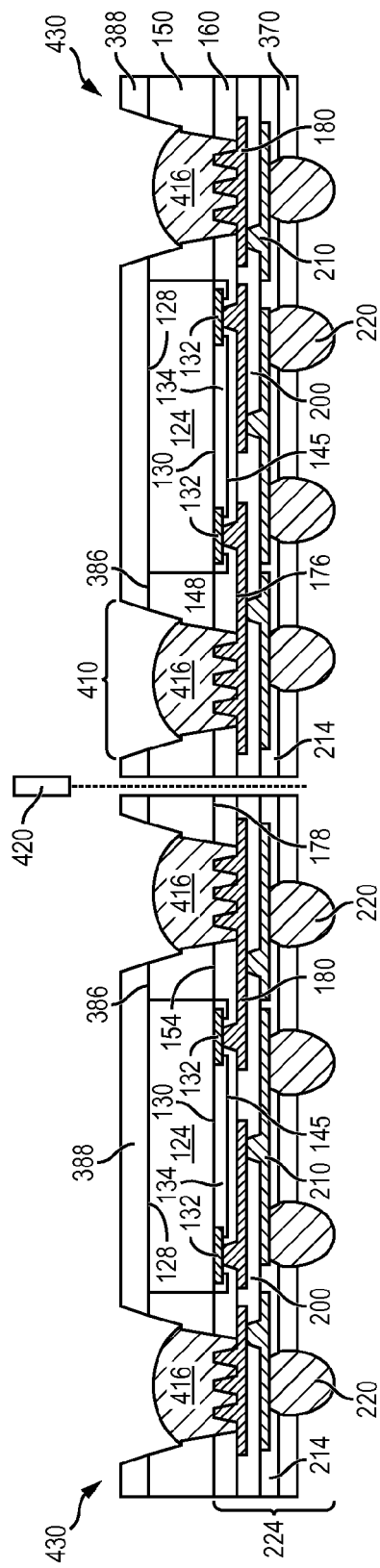

In FIG. 8g, the assembly from FIG. 8f is singulated through insulating layer 388, encapsulant 150, and insulating layers 160, 200, 214, and 370 with saw blade or laser cutting tool 420 into individual Fo-WLCSPs 430.

Figure 9:
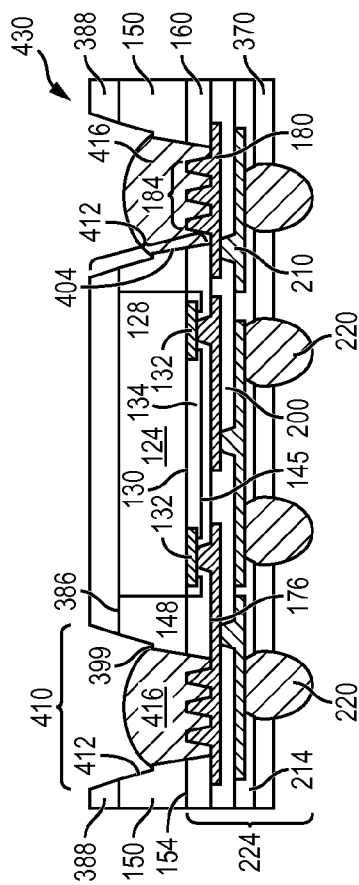
FIG. 9 illustrates a 3-D Fo-WLCSP having a vertical interconnect structure with front-side and backside protection and balance layers.

FIG. 9 shows Fo-WLCSP 430 after singulation. Fo-WLCSP 430 provides 3-D electrical interconnection with a fan-out RDL and conductive micro via array 184 formed outside a footprint of a semiconductor die 124. An encapsulant 150 is deposited over semiconductor die 124. An insulating layer 160 is formed over active surface 130 of semiconductor die 124 and encapsulant 150. A conductive layer 180 is formed over insulating layer 160 and is electrically connected to conductive layer 132 of semiconductor die 124. A portion of conductive layer 180 extends horizontally along insulating layer 160 and parallel to active surface 130 of semiconductor die 124 to laterally redistribute the electrical interconnect to conductive layer 132 of semiconductor die 124. Conductive layer 180 operates as a fan-out RDL, providing lateral or horizontal redistribution for the electrical signals of semiconductor die 124. Conductive layer 180 has a conductive micro via array 184 formed outside a footprint of semiconductor die 124. Conductive micro via array 184 includes one or more conductive micro vias 182. Conductive micro via array 184 extends from the horizontal portion of conductive layer 180 through insulating layer 160 to surface 154 of encapsulant 150.

An insulating layer 370 is formed over and around bumps 220 and insulating layer 214. Insulating layer 370 operates as a front-side protection, supporting, and balancing layer, providing environmental protection for the semiconductor device from external elements and contaminants. Additionally, insulating layer 370 provides structural support for the package, balancing stress on the package, and reducing warping or cracking of the package. Accordingly, in one embodiment, insulating layer 370 has a CTE similar or equal to insulating layer 214, and encapsulant 150. An insulating layer 388 is formed over backside surface 386 of encapsulant 150 and back surface 128 of semiconductor die 124. Insulating layer 388 operates as a backside protection and balancing layer, providing environmental protection for the semiconductor device from external elements and contaminants. Additionally, insulating layer 388 provides structural support for the package, to balance stress on the package, and reduce warping or cracking of the package during subsequent handling and processing. Accordingly, in one embodiment, insulating layer 388 has a CTE similar or equal to insulating layer 370 and encapsulant 150.

A portion of encapsulant 150 and insulating layers 160 and 388 is removed over conductive micro via array 184 to form openings 410, which constitute a TMH. Openings 410 have a first diameter or cross-sectional width ranging from 50-150 μm, and a second diameter or cross-sectional width ranging from 180-450 μm. Thus, openings 410 have a stepped sidewall 412, and openings 410 constitute a TMH with a step-through-hole structure. The step-through-hole structure increases structural support and reduces damage to the package, including build-up interconnect structure 224, during processing, for example, during a desmearing process, solder capping, or a package-on-package stack soldering process.

Openings 410 expose conductive micro via array 184 and conductive micro vias 182 of conductive layer 180 through encapsulant 150. The exposed conductive micro via array 184 provides a greater exposed surface area for conductive layer 180 than would be exposed if the exposed conductive layer 180 were flat or planar. Conductive micro via array 184 thereby provides greater contact surface area between conductive layer 180 and subsequently deposited conductive bump material than if the exposed portion of conductive layer 180 were flat or planar. The additional exposed surface area of conductive layer 180, resulting from conductive micro via array 184, provides for improved and more robust electrical and mechanical contact between subsequently deposited conductive bump material and conductive layer 180.

An electrically conductive bump material is deposited within openings 410 over conductive layer 180 to form bumps 416. Bumps 416 are formed over conductive layer 180 and over and between conductive micro vias 182 of conductive micro via array 184. Accordingly, a 3-D interconnection for next level interconnection is formed through bumps 416, conductive layer 180, build-up interconnect structure 224, and semiconductor die 124. The 3-D interconnection provides horizontal and vertical electrical interconnection for semiconductor die 124 without a backside interconnect or RDL over a footprint of semiconductor die 124. Conductive micro vias 182 provide an increased contact surface area and improved and more robust mechanical and electrical connection between conductive layer 180 and bumps 416.

In summary, a semiconductor device (Fo-WLCSP 280) has a semiconductor die (semiconductor die 124). An encapsulant (encapsulant 150) is formed over the semiconductor die (semiconductor die 124). A conductive micro via array (conductive micro via array 184) is formed over the encapsulant (encapsulant 150) outside a footprint of the semiconductor die (semiconductor die 124). A first TMH having a step-through-hole structure (opening 260) is formed through the encapsulant (encapsulant 150) to expose the conductive micro via array (conductive micro via array 184). Forming the conductive micro via array (conductive micro via array 184) further includes forming an insulating layer (insulating layer 160) over the encapsulant (encapsulant 150) and the semiconductor die (semiconductor die 124), forming a micro via array (micro via array 174) through the insulating layer (insulating layer 160) outside the footprint of the semiconductor die (semiconductor die 124), and forming a conductive layer (conductive layer 180) over the insulating layer (insulating layer 160. Forming the conductive micro via array (conductive micro via array 192) further includes forming a conductive ring (conductive ring 190). Forming the first TMH (opening 260) further includes forming a second TMH (opening 240) partially through the encapsulant (encapsulant 150) to a recessed surface (recessed surface 244) of the encapsulant (encapsulant 150), and forming a third TMH (opening 250) through the encapsulant (encapsulant 150) within a footprint of the second TMH (opening 240) having a cross-sectional width less than a cross-sectional width of the second TMH (opening 240) and extending from the recessed surface (recessed surface 244) of the encapsulant (encapsulant 150) to the conductive micro via array (conductive micro via array 184). An insulating layer (insulating layer 318; insulating layer 370; insulating layer 388) is formed over the semiconductor die (semiconductor die 124) for structural support. A build-up interconnect structure (build-up interconnect structure 224) is formed over the semiconductor die (semiconductor die 124).

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over the semiconductor die;
    forming a conductive micro via array outside a footprint of the semiconductor die and over the encapsulant; and
    forming a first through-mold-hole (TMH) through the encapsulant extending to the conductive micro via array.

2. The method of claim 1, wherein forming the conductive micro via array includes:
    forming an insulating layer over the semiconductor die and the encapsulant;
    forming a micro via array through the insulating layer and outside the footprint of the semiconductor die; and
    forming a conductive layer over the insulating layer and into the micro via array.

3. The method of claim 1, the conductive micro via array includes a conductive ring.

4. The method of claim 1, further including:
    forming a second TMH partially through the encapsulant to a recessed surface of the encapsulant; and
    forming a third TMH through the encapsulant within a footprint of the second TMH having a cross-sectional width less than a cross-sectional width of the second TMH and extending from the recessed surface of the encapsulant to the conductive micro via array.

5. The method of claim 1, further including forming a build-up interconnect structure over the semiconductor die.

6. The method of claim 1, further including forming an insulating layer over the semiconductor die for structural support.

7. A method of making a semiconductor device, comprising:
    providing a semiconductor die;
    depositing an encapsulant over the semiconductor die; and
    forming a conductive micro via array including a plurality of conductive vias over the encapsulant and outside a footprint of the semiconductor die.

8. The method of claim 7, further including forming a first through-mold-hole (TMH) comprising a step-through-hole structure through the encapsulant extending to the conductive micro via array.

9. The method of claim 8, further including:
    forming a second TMH partially through the encapsulant to a recessed surface of the encapsulant; and
    forming a third TMH through the encapsulant and within a footprint of the second TMH, the third TMH comprising a cross-sectional width less than a cross-sectional width of the second TMH and extending from the recessed surface of the encapsulant to the conductive micro via array.

10. The method of claim 8, further including forming a conductive interconnect structure within the first TMH.

11. The method of claim 7, wherein forming the conductive micro via array includes:
    forming an insulating layer over the encapsulant and the semiconductor die;
    forming a micro via array through the insulating layer and outside the footprint of the semiconductor die; and
    forming a conductive layer over the insulating layer and into the micro via array.

12. The method of claim 11, wherein the insulating layer includes a polymer composite including glass fiber.

13. The method of claim 7, further including forming an insulating layer over the semiconductor die for structural support.

14. A method of making a semiconductor device, comprising:
    providing a semiconductor die;
    forming an encapsulant over the semiconductor die;
    forming an insulating layer over the encapsulant;
    forming a conductive micro via array through the insulating layer; and
    forming an opening in the encapsulant extending to the conductive micro via array.

15. The method of claim 14, further including forming an interconnect structure over the encapsulant.

16. The method of claim 14, wherein the conductive micro via array includes a conductive ring.

17. The method of claim 14, wherein the insulating layer includes a polymer composite including glass fiber.

18. The method of claim 14, wherein the opening includes a step-through-hole structure formed through the encapsulant extending to the conductive micro via array.

19. The method of claim 18, wherein the step-through-hole structure includes:
    forming a first through-mold-hole (TMH) partially through the encapsulant; and
    forming a second TMH through the encapsulant and within a footprint of the first TMH.

20. The method of claim 14, further including removing a portion of the encapsulant.

21. A method of making a semiconductor device, comprising:
    providing a semiconductor die;
    forming an insulating layer over the semiconductor die; and
    forming a conductive micro via array including a plurality of commonly connected conductive vias through the insulating layer.

22. The method of claim 21, further including forming an interconnect structure over the insulating layer.

23. The method of claim 21, wherein the conductive micro via array further includes a conductive ring.

24. The method of claim 21, wherein the insulating layer further includes a polymer composite including glass fiber.

25. The method of claim 21, further including:
    forming an encapsulant over the semiconductor die; and
    forming an opening through the encapsulant extending to the conductive micro via array.

26. The method of claim 25, further including removing a portion of the encapsulant.

27. The method of claim 25, further including forming a bump within the opening over the conductive micro via array.

28. The method of claim 14, further including forming a bump within the opening over the conductive micro via array.

29. A method of making a semiconductor device, comprising:
    providing an insulating layer;
    forming a conductive layer over the insulating layer, the conductive layer including an array of conductive vias extending from the conductive layer through the insulating layer;
    providing a semiconductor component over the insulating layer; and
    depositing an encapsulant over the semiconductor component and insulating layer.

30. The method of claim 29, further including removing a portion of the encapsulant.

31. The method of claim 29, further including forming an opening through the encapsulant extending to the array of conductive vias.

32. The method of claim 31, wherein the opening includes a step-through-hole structure.

33. The method of claim 31, further including forming a bump within the opening over the array of conductive vias.

34. The method of claim 29, further including forming a conductive ring around the array of conductive vias.

35. The method of claim 29, further including forming an interconnect structure over the insulating layer and array of conductive vias.

* * * * *